(12) United States Patent
Yoshida et al.

(10) Patent No.: US 7,270,708 B2
(45) Date of Patent: Sep. 18, 2007

(54) SUSCEPTOR, VAPOR PHASE GROWTH APPARATUS, EPITAXIAL WAFER MANUFACTURING APPARATUS, EPITAXIAL WAFER MANUFACTURING METHOD, AND EPITAXIAL WAFER

(75) Inventors: Tomosuke Yoshida, Annaka (JP); Takeshi Arai, Annaka (JP); Kenji Akiyama, Nishishirakawa-gun (JP); Hiroki Ose, Nishishirakawa-gun (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 362 days.

(21) Appl. No.: 10/493,144

(22) PCT Filed: Nov. 27, 2002

(86) PCT No.: PCT/JP02/12368

§ 371 (c)(1),
(2), (4) Date: Apr. 20, 2004

(87) PCT Pub. No.: WO03/046966

PCT Pub. Date: Jun. 5, 2003

(65) Prior Publication Data

US 2004/0255843 A1 Dec. 23, 2004

(30) Foreign Application Priority Data

Nov. 30, 2001 (JP) .............................. 2001-366882
Feb. 27, 2002 (JP) .............................. 2002-051842
Mar. 28, 2002 (JP) .............................. 2002-092493

(51) Int. Cl.
*C30B 25/12* (2006.01)
(52) U.S. Cl. .......................... 117/101; 117/88; 117/90; 117/98
(58) Field of Classification Search .................. 117/88, 117/90, 98, 101
See application file for complete search history.

(56) References Cited

U.S. PATENT DOCUMENTS

| 6,129,047 | A | 10/2000 | Nakamura |
| 6,444,027 | B1 | 9/2002 | Yang et al. |
| 2001/0037761 | A1 | 11/2001 | Ries et al. |

FOREIGN PATENT DOCUMENTS

| JP | A 62-73621 | 4/1987 |
| JP | A 4-78130 | 3/1992 |
| JP | U 5-33523 | 4/1993 |
| JP | A 8-8198 | 1/1996 |
| WO | WO 01/86034 A2 | 11/2001 |

*Primary Examiner*—Felisa Hiteshew
(74) *Attorney, Agent, or Firm*—Oliff & Berridge, PLC

(57) ABSTRACT

A susceptor (10) supporting a semiconductor substrate (W) in a vapor phase growth, wherein a pocket (11) is formed on an upper surface of the susceptor to arrange the semiconductor substrate (W) inside thereof. The pocket (11) has a two-stage structure having an upper stage pocket (11a) for supporting an outer peripheral edge portion of the semiconductor substrate (W) and a lower stage pocket (11b) formed on a lower stage of a center side from the upper stage pocket (11a). A hole (12) penetrated to a rear surface of the susceptor and opened in the vapor phase growth is formed in the lower stage pocket (11b).

4 Claims, 21 Drawing Sheets

⟨THIRD EPITAXIAL WAFER⟩

⟨FIRST EPITAXIAL WAFER⟩

ALL SFQR VALUES ARE LESS THAN 0.1 μm

SUSCEPTOR, VAPOR PHASE GROWTH APPARATUS, EPITAXIAL WAFER MANUFACTURING APPARATUS, EPITAXIAL WAFER MANUFACTURING METHOD, AND EPITAXIAL WAFER

This application is a 371 or PCT/jp02/12368 Nov. 27, 2002.

FIELD OF THE INVENTION

This invention relates to a susceptor, a vapor phase growth apparatus, an epitaxial wafer manufacturing apparatus, an epitaxial wafer manufacturing method, and an epitaxial wafer.

BACKGROUND ART

In a related art, vapor phase growth of an epitaxial layer onto a main surface of a semiconductor substrate (hereinafter, simply referred as substrate) is performed by disposing a susceptor in a reaction chamber, heating the substrate to a desired growth temperature by a heating apparatus in an arrangement state of the substrate on the susceptor and supplying a reaction gas on the main surface of the substrate by a gas supply apparatus.

When vapor phase growth of an epitaxial layer of low dopant concentration (that is, high resistivity) is performed on a substrate of high dopant concentration (that is, low resistivity), for example, when vapor phase growth of a p-type silicon epitaxial layer (hereinafter, simply referred as epitaxial layer) is performed on a $P^+$-type boron(B)-doped substrate, a phenomenon (hereinafter, referred as autodoping) that dopant once released from inside of the substrate into vapor phase is doped into the epitaxial layer occurs. This autodoping is caused by dopant outdiffused from the substrate by heating and dopant released from inside of the substrate due to vapor phase etching of a surface of the substrate. When autodoping occurs, a problem is arisen that dopant concentration of the epitaxial layer after vapor phase growth increases along a direction from the center to a peripheral edge of the layer (contrarily, in a case of $p/p^+$-type or $n/n^+$-type, resistivity decreases along the direction from the center to the peripheral edge).

In the related art, to prevent an occurrence of such autodoping, in-plane uniformity of dopant concentration (and resistivity) is performed by forming in advance a silicon oxide film ($SiO_2$ film, hereinafter, simply referred as oxide film) on a rear surface of the substrate and by performing vapor phase growth while preventing release of dopant from inside of the substrate due to the oxide film.

However, as described above, when vapor phase growth is performed after forming the oxide film in advance on the rear surface of the substrate, a process for forming the oxide film is required, and productivity deteriorates.

Further, to perform in-plane uniformity of dopant concentration, for example, as shown in Japanese Patent Application Laid Open No. 223545/1998, a vapor phase growth susceptor with a hole penetrating to a rear surface at an outermost peripheral portion of a pocket (concavity formed in an almost substrate shape; wafer pocket in this publication) arranged to place the substrate in a positioning state is proposed. In this susceptor, in-plane resistivity (and dopant concentration) distribution is not improved so much (resistivity in a case of $p/p^+$-type or $n/n^+$-type has in-plane distribution so as to be considerably lowered along a direction from the center to a peripheral edge portion of an epitaxial wafer; referred to data of a susceptor 100 in FIGS. 4, 5 and 6).

This invention has been accomplished to solve the above problem, and an object of this invention is to provide a susceptor, a vapor phase growth apparatus, an epitaxial wafer manufacturing method and an epitaxial wafer in which in-plane uniformity of dopant concentration and resistivity can be easily obtained.

Another object of this invention is to provide a susceptor and epitaxial wafer manufacturing apparatus and method in which in-plane uniformity of resistivity (dopant concentration) of an epitaxial wafer can be easily obtained without forming in advance an oxide film on a rear surface of a substrate.

DISCLOSURE OF THE INVENTION

As described above, as shown in FIG. 27, the reason why in-plane uniformity of dopant concentration is not sufficiently obtained is that because there is a hole 102 at an outermost peripheral portion of a susceptor 101, gas including dopant released from a substrate W is carried afloat (arrow B) with gas flowing in a pocket from a lower side of the susceptor 101 through the hole 102 by air flow (arrow A) on an upper side of the substrate W, flowing along an epitaxial layer on an upper surface of the substrate W, and is taken into the epitaxial layer.

Therefore, in accordance with a first aspect of this invention, in the susceptor of this invention, a susceptor supporting a semiconductor substrate in a vapor phase growth, wherein a pocket is formed on an upper surface of the susceptor to arrange the semiconductor substrate inside thereof, the pocket has a two-stage structure having an upper stage pocket for supporting an outer peripheral edge portion of the semiconductor substrate and a lower stage pocket formed on a lower stage of a center side from the upper stage pocket, and a hole penetrated to a rear surface of the susceptor and opened in the vapor phase growth is formed in the lower stage pocket.

In this case, the hole formed in the lower stage pocket formed on the center side from the annular-shaped upper stage pocket supporting the outer peripheral edge portion of the semiconductor substrate is necessarily placed on a center side from the outermost peripheral portion in the pocket and faces a portion on a center side from an outer peripheral end of the semiconductor substrate.

In accordance with a second aspect of this invention, in the susceptor of this invention, a susceptor supporting a semiconductor substrate in a vapor phase growth, wherein a pocket is formed on an upper surface of the susceptor to arrange the semiconductor substrate inside thereof, and a hole penetrated to a rear surface of the susceptor and opened in the vapor phase growth is formed on a center side from an outermost peripheral portion in the pocket.

There is a susceptor in which a hole for lift pin penetration (hereinafter, a lift pin through hole) is formed. In a normal case, during vapor phase growth, the lift pin through hole is closed by a head part of the lift pin, and gas flow is substantially impossible. Therefore, the hole does not correspond to "hole opened in vapor phase growth". The lift pin denotes a pin which is arranged capable of going up and down relatively to the susceptor and is used to make the semiconductor substrate attached and detached to/from the susceptor while the pin goes up and down in a state to support the semiconductor substrate from a lower surface side thereof.

According to the susceptor of this invention, because the hole penetrating to the rear surface of the susceptor is formed on the center side from the outermost peripheral portion in the pocket, dopant outdiffused from the semiconductor substrate (hereinafter, sometimes simply referred as a substrate) by heating in vapor phase growth, or dopant released from the semiconductor substrate by vapor phase etching can be properly released from the lower surface side of the susceptor through the hole formed in the pocket of the susceptor. Accordingly, it can be properly suppressed that these dopant go around to the main surface side of the substrate. Therefore, the occurrence of the autodoping can be considerably suppressed without forming an oxide film for preventing autodoping on the rear surface of the substrate. As a result, in-plane uniformity of dopant concentration and resistivity can be performed. That is, in-plane uniformity of dopant concentration and resistivity can be easily obtained.

Preferably, in the susceptor of this invention, the hole is set to a position facing a portion on a center side from the outer peripheral end of the semiconductor substrate. In this case, because the hole is positioned in the shadow of the substrate with respect to air flow formed in the upper side of the substrate in vapor phase growth, inflow of gas (gas on a lower side of the susceptor) in the pocket through the hole can be suppressed. Accordingly, dopant released from inside of the substrate can be further reliably suppressed to go around to the main surface of the substrate. As a result, the occurrence of autodoping can be further properly prevented.

It is preferable that the susceptor of this invention has the hole which is formed at a position facing a rear surface of a chamfer formed at the outer peripheral edge portion of the semiconductor substrate. In this case, because dopant released from the chamfer by vapor phase etching, which most considerably receives vapor phase etching in a process of vapor phase growth can be released to a lower side of the susceptor through the hole, the occurrence of autodoping can be further appropriately prevented.

Incidentally, if dopant released from the substrate by heating or the like goes around to the main surface of the substrate, it is performed through the outer peripheral portion of the substrate. Thus, it is preferable that the susceptor of this invention has the hole formed at a position facing an outer peripheral edge portion of the rear surface of the semiconductor substrate. In this case, dopant released from inside of the semiconductor substrate can be released to the lower side of the susceptor through the hole before the dopant going around to the main surface of the substrate.

Preferably, the susceptor of this invention has the large number of holes formed in all over a circumference having a center almost equal to that of the pocket. In this case, the above effect to prevent the occurrence of autodoping can be obtained in all circumferential directions of the substrate.

Further, in an epitaxial wafer manufactured by using the susceptor in this case, dot-shaped rising portions are formed on all over a circumference corresponding to the large number of holes on the surface of the epitaxial wafer by the following reasons.

In vapor phase growth, gas (mainly, $H_2$ gas) exists in each hole of the susceptor, however, heat conductivity of the gas is lower than that of the constituent material of the susceptor (for example, graphite), so that a portion corresponding to each hole locally becomes a high temperature portion having high temperature on the semiconductor substrate (because a heat quantity conducting from the semiconductor substrate to the gas in the hole per unit area becomes smaller than that from the semiconductor substrate to the susceptor substrate).

As a result of increased growth rate of an epitaxial layer at the high temperature portion, the thickness of this portion becomes larger than that of other portions. For this reason, when the susceptor used for vapor phase growth comprises the large number of holes formed in all over a circumference having a center almost equal to that of the pocket, a manufactured epitaxial wafer has a feature that the rising portions which rise in dot-shape due to the large film thickness of the epitaxial layer compared to film thickness of the surroundings of the rising portions on the surface of epitaxial layer are formed on all over the circumference.

The rising portions are formed on the circumference corresponding to the holes formed in the susceptor, so that a form and a source of generation are different from rising portions of projection defect or stacking fault generated by particles or the like irrespective of positions of holes of a susceptor.

Preferably, the susceptor of this invention has a large number of holes formed in all over a surface of the pocket. In this case, the above effect to prevent the occurrence of autodoping can be obtained in all over the surface of the substrate.

Preferably, the susceptor of this invention has a large number of holes formed in all over a surface of the lower stage pocket. In this case also, the above effect to prevent the occurrence of autodoping can be obtained in all over the surface of the substrate.

In an epitaxial wafer manufactured by using the susceptor in which the large number of holes are formed in all over the surface of the pocket or the lower stage pocket, dot-shaped rising portions are formed at a position corresponding to each hole on an epitaxial layer. That is, rising portions are formed on all over the surface of the epitaxial layer.

Preferably, the susceptor of this invention has a hole formed in a circular-arc shape in a circumference having a center almost equal to that of the pocket. In this case also, the above effect to prevent the occurrence of autodoping can be obtained by the holes.

Preferably, the susceptor of this invention has an annular shaped hole having a center almost equal to that of the pocket. In this case also, the above effect to prevent the occurrence of autodoping can be obtained by the holes.

In an epitaxial wafer manufactured by using the susceptor having the circular-arc shaped or the annular shaped hole, there is formed a rising portion rising in a circular-arc shape or an annular shape (corresponding to the shape of the hole) due to a large film thickness compared to that of a surrounding of the rising portion at a position corresponding to the hole on an epitaxial layer.

The number of the holes is preferably, for example, three or more, more preferably ten or more, and most preferably twenty or more.

In accordance with a third aspect of this invention, a vapor phase growth apparatus comprises: the susceptor of this invention; a reaction chamber for a vapor phase growth of an epitaxial layer on a main surface of the semiconductor substrate by disposing the susceptor, in which the semiconductor substrate is arranged in the pocket formed on the upper surface of the susceptor, inside the reaction chamber; and a heating apparatus for heating the semiconductor substrate in a vapor phase growth.

In accordance with a forth aspect of this invention, the epitaxial wafer manufacturing method comprises: arranging the semiconductor substrate in the pocket of the susceptor of the vapor phase growth apparatus of this invention; disposing the susceptor in the reaction chamber; heating the semiconductor substrate on the susceptor by the heating apparatus; performing a vapor phase growth of the epitaxial layer on the main surface of the semiconductor substrate; and manufacturing an epitaxial wafer.

Preferably, a vapor phase growth is performed while flowing a gas approximately parallel to the susceptor (substrate) onto both of upper and rear surface sides of the susceptor. Accordingly, gas including dopant released from the substrate may be sectioned through the hole by gas flowing in the lower side of the susceptor to be properly released to the lower side of the susceptor through the hole.

Further, preferably, in the epitaxial wafer manufacturing method of this invention, the semiconductor substrate in which, for example, a boron (B) or an arsenic (As) is added is used.

In the above description, it was explained that on the surface of the epitaxial layer of the epitaxial wafer manufactured by using the susceptor of this invention, the rising portions rising due to the large film thickness of the epitaxial layer compared to that of the surrounding of the rising portions are formed at the positions corresponding to holes of the susceptor, however, it was found out that the size of the rising portions can be adjusted by controlling inside diameter or inside width of the holes. Moreover, it was found out that when the inside diameter of the holes is reduced to certain degree or less, the rising portions can be extremely small, and when the inside diameter of the holes is reduced more, an occurrence of the rising portions can be substantially prevented.

That is, in the epitaxial wafer manufacturing method of this invention, a size of a rising portion which is formed due to a large film thickness of the epitaxial layer compared to that of a surrounding of the rising portion on a surface of the epitaxial layer of the epitaxial wafer to be manufactured may be controlled by adjusting an inside diameter or an inside width of the hole of the susceptor.

Preferably, in the susceptor of this invention, when the hole is formed in a cylindrical shape, an inside diameter of the hole is 3 mm or less. Thereby, the rising portion to be formed can be extremely small (for example, less than 0.05 µm in height).

Preferably, in the susceptor of this invention, an inside diameter of the cylindrical shaped hole is 2 mm or less. Thereby, the occurrence of the rising portion can be substantially prevented.

In accordance with a fifth aspect of this invention, in the epitaxial wafer of this invention, a dot-shaped rising portion rising due to a large film thickness compared to that of a surrounding of the rising portion is formed on all over a circumference on a surface of an epitaxial layer.

In accordance with a sixth aspect of this invention, in the epitaxial wafer of this invention, a dot-shaped rising portion rising due to a large film thickness compared to that of a surrounding of the rising portion is formed on all over a surface of an epitaxial layer.

In accordance with a seventh aspect of this invention, in the epitaxial wafer of this invention, a circular-arc-shaped rising portion rising due to a large film thickness compared to that of a surrounding of the rising portion is formed on a surface of an epitaxial layer.

In accordance with an eighth aspect of this invention, in the epitaxial wafer of this invention, an annular-shaped rising portion rising due to a large film thickness compared to that of a surrounding of the rising portion is formed on a surface of an epitaxial layer.

Further, preferably, in the epitaxial wafer of this invention, the rising portion is formed at a position corresponding to a hole of a susceptor.

In accordance with a ninth aspect of this invention, in the susceptor of this invention, a susceptor supporting a semiconductor substrate in a vapor phase growth comprises: a through hole penetrating from a surface for supporting the semiconductor substrate to a rear surface, wherein the through hole comprises an overheat suppressing portion for suppressing a local overheating of the semiconductor substrate by preventing a direct heat radiation through the through hole from a heat source for heating the semiconductor substrate supported by the susceptor from a rear surface side through the susceptor.

According to the susceptor of this invention, since the susceptor comprises the through hole penetrating from the surface for supporting the semiconductor substrate to the rear surface, dopant outdiffused from the substrate semiconductor by heating in vapor phase growth, or dopant released from inside of the semiconductor substrate by vapor phase etching can be properly released from the rear surface side of the susceptor through the through hole. Thus, the dopant can be reliably suppressed to go around to the main surface of the substrate. Therefore, the occurrence of the autodoping can be considerably suppressed without forming an oxide film for preventing autodoping on the rear surface of the substrate. As a result, in-plane uniformity of dopant concentration and resistivity can be performed. That is, in-plane uniformity of dopant concentration and resistivity can be easily obtained without any specific process.

For example, in a case that the susceptor comprises a through hole which is perpendicular to the susceptor surface and linearly penetrates from the surface for supporting the semiconductor substrate to the rear surface thereof, a portion corresponding to the through hole on the semiconductor substrate is locally overheated by the direct heat radiation through the through hole from the heat source for heating the semiconductor substrate supported by the susceptor from the rear surface side through the susceptor. As a result, epitaxial film thickness of a portion corresponding to the through hole becomes large on the semiconductor substrate, thereby forming a rising portion on an epitaxial layer.

Contrary to this, since the through hole of the susceptor of this invention comprises the overheat suppressing portion, the direct heat radiation from the heat source to the semiconductor substrate through the through hole can be prevented. Therefore, locally overheating of semiconductor substrate can be suppressed. Accordingly, an occurrence of variation of film thickness with respect to the epitaxial layer can reliably be suppressed, and flatness of the epitaxial layer can be improved.

Further, in accordance with a tenth aspect of this invention, in the susceptor of this invention, a susceptor supporting a semiconductor substrate in a vapor phase growth, wherein holes are formed from a surface for supporting the semiconductor substrate and a rear surface thereof, respectively, the holes being shifted in relation to each other for partially overlapping with each other, each of the holes is formed to have a depth to communicate with each other inside the susceptor without penetrating the susceptor, and a through hole which penetrates from the surface for supporting the semiconductor substrate to the rear surface is formed by a combination of the holes.

In this case, bottom portions of the holes formed from the surface for supporting the semiconductor substrate and the rear surface thereof, respectively, comprises the overheat suppressing portions for preventing the direct heat radiation from the heat source to the semiconductor substrate.

In accordance with an eleventh aspect of this invention, in the epitaxial wafer manufacturing apparatus of this invention, an epitaxial wafer manufacturing apparatus for manufacturing an epitaxial wafer by performing a vapor phase growth of an epitaxial layer on a main surface of a semiconductor substrate comprises: the susceptor of this invention.

In accordance with a twelfth aspect of this invention, an epitaxial wafer manufacturing method of this invention comprises: performing a vapor phase growth of an epitaxial layer on a main surface of a semiconductor substrate supported by the susceptor of this invention; and manufacturing an epitaxial wafer.

BEST MODE FOR CARRYING OUT THE INVENTION

Hereinafter, embodiments according to this invention will be described with reference to the drawings.

FIRST EMBODIMENT

Initially, a susceptor 10 will be described with reference to FIGS. 1A and 1B as an example of a susceptor described according to this embodiment.

Figure 1A:
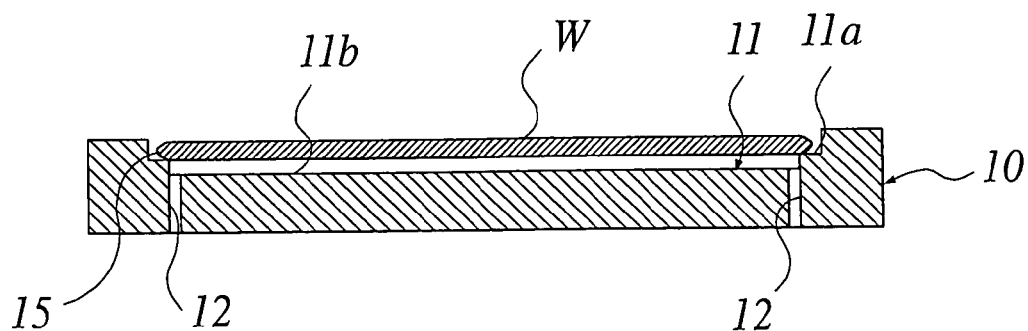
FIG. 1A is a front sectional view showing an example of a susceptor according to this invention.
Figure 1B:
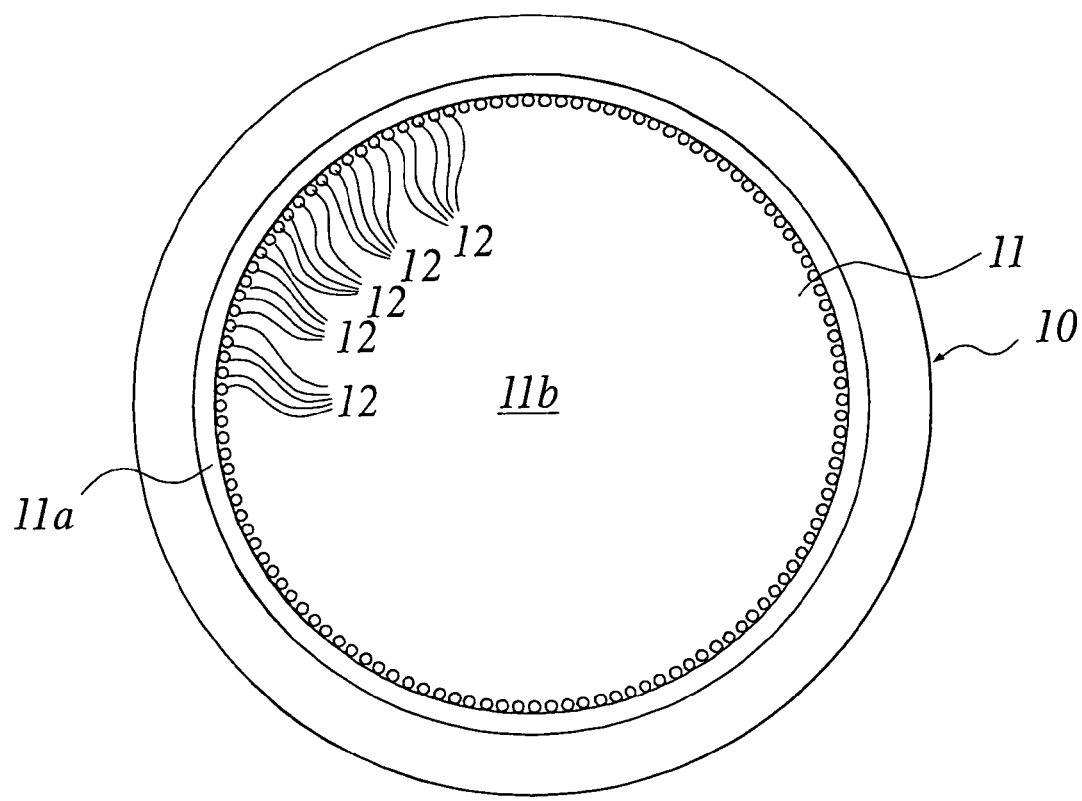
FIG. 1B is a plane view of the susceptor shown in FIG. 1A.

As shown in FIG. 1, the susceptor 10 is formed in an almost disk shape, and a pocket 11 is formed on a main surface of the susceptor 10. A semiconductor substrate W (FIG. 1A; hereinafter, simply referred as a substrate W) is arranged inside the pocket 11.

This pocket 11 has a two-stage structure having an annular-shaped upper stage pocket 11a for supporting an outer peripheral edge portion of the substrate W, for example, in a state shown in FIG. 1A and a lower stage pocket 11b formed on a lower stage of a center side from the upper stage pocket 11a. The upper stage pocket 11a and the lower stage pocket 11b are both formed, for example, in almost flat.

A chamfer 15 is formed at the outer peripheral edge portion of the substrate W. The upper stage pocket 11a, for example, may be set to have a size capable of supporting a portion of the substrate W from inside the chamfer 15 to the chamfer 15, or may be set to have a size capable of supporting only a portion of the substrate W inside the chamfer 15.

A large number (for example, twenty or more) of holes 12 (in FIG. 1B, only a part of the holes 12 are indicated by reference numerals) penetrated to a rear surface of the susceptor 10 and opened in the vapor phase growth are formed in the lower stage pocket 11b of the pocket 11. The holes 12 formed in the lower stage pocket 11b formed at the center side from the annular-shaped upper stage pocket 11a supporting the outer peripheral edge portion of the substrate W are necessarily positioned at a center side from an outermost peripheral portion in the pocket 11 corresponding to an outermost peripheral portion of the upper stage pocket 11a and face a portion on a center side from an outer peripheral end of the substrate W.

More specifically, each hole 12 is arranged at an equal interval, for example, on a circumference of an outermost peripheral portion of the lower stage pocket 11b. That is, each of the holes 12 are formed in all over the circumference having a center almost equal to that of the pocket 11, and each hole 12 faces the outer peripheral edge portion of the rear surface of the substrate W.

Next, with reference to FIGS. 2A and 2B, a susceptor 20 will be described as another example of the susceptor described in this embodiment.

In this susceptor 20, as described hereinafter, arrangement of the holes 12 differs from the above-described susceptor 10, and the susceptor 20 is the same as the susceptor 10 in other points. Therefore, the same constitutional elements as those of the susceptor 10 are indicated by the same reference numerals, and description of the constitutional elements is omitted.

Figure 2A:
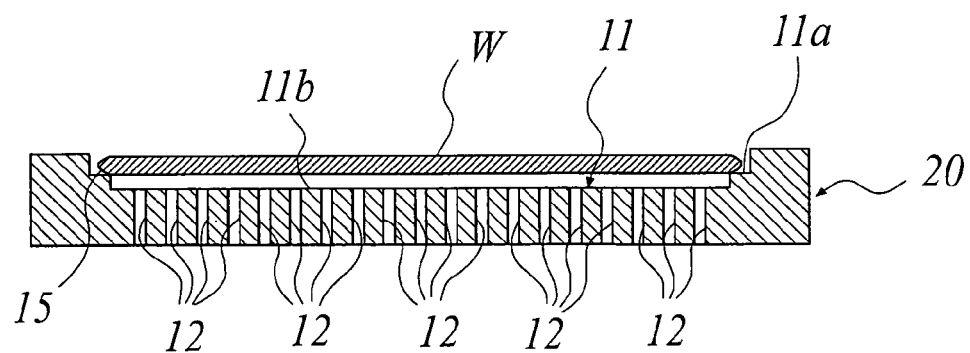
FIG. 2A is a front sectional view showing an example of a susceptor according to this invention.
Figure 2B:
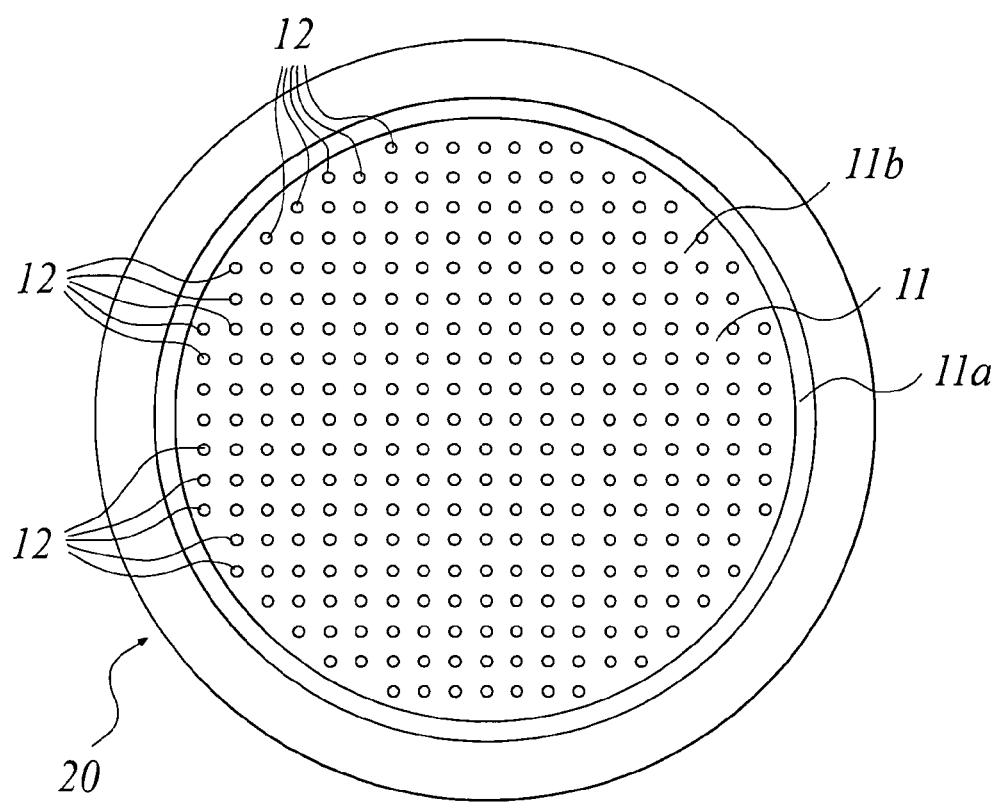
FIG. 2B is a plane view of the susceptor shown in FIG. 2A.

That is, as shown in FIGS. 2A and 2B, a large number of holes 12 are formed so as to be arranged in all over the lower stage pocket 11b of the susceptor 20 (in FIG. 2B, only a part of holes 12 are indicated by reference numerals).

Each of the above-described susceptors 10, 20 is, for example made from graphite coated with silicon carbide.

Next, a composition of a vapor phase growth apparatus 30 will be explained referring to FIG. 3.

Figure 3:
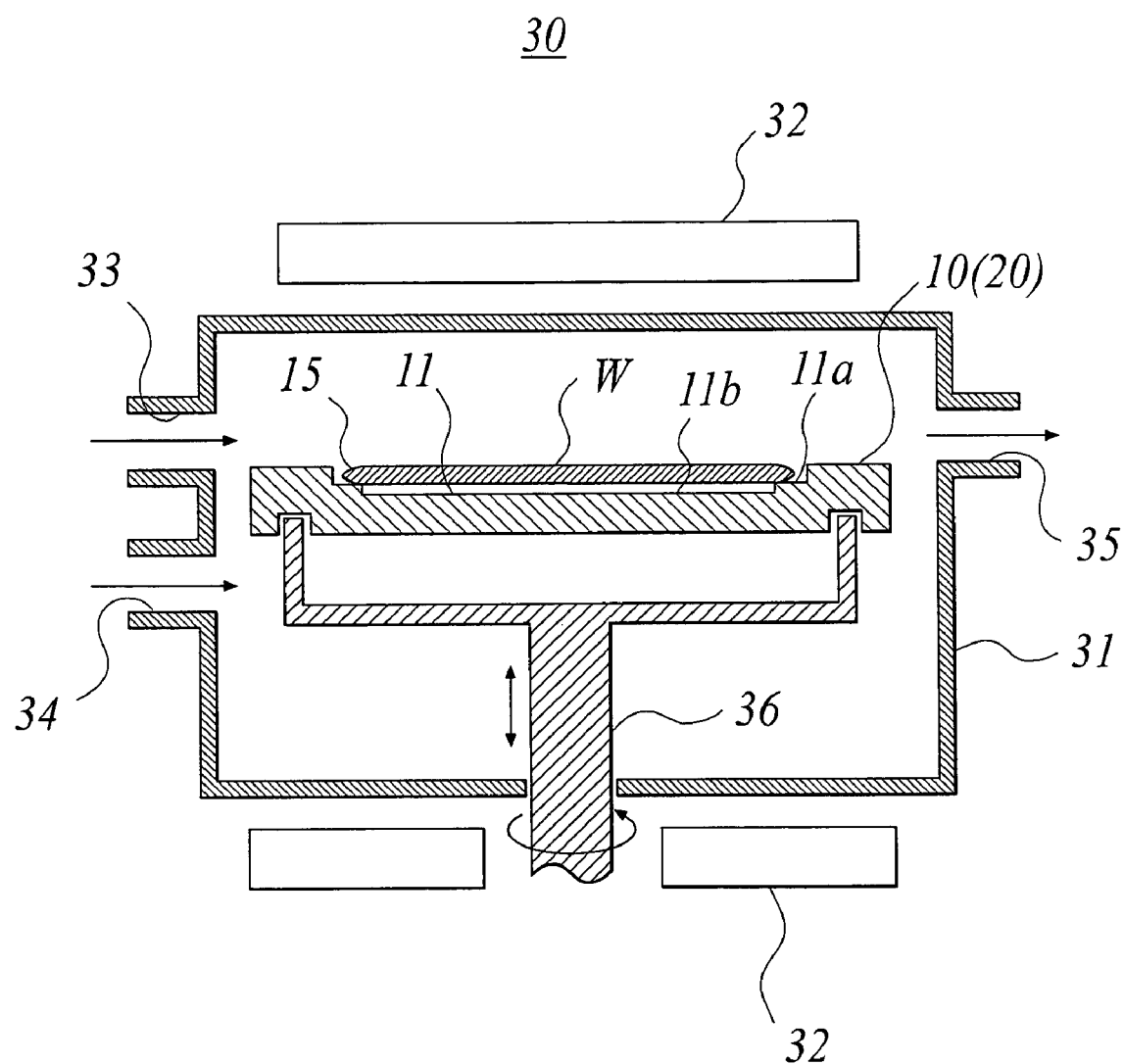
FIG. 3 is a schematic view showing a vapor phase growth apparatus according to this invention.

As shown in FIG. 3, the vapor phase growth apparatus 30 substantially comprises the above-described susceptor 10 (or the above-described susceptor 20), a reaction chamber 31 for disposing the susceptor 10 (20) inside thereof in an approximately parallel state, a susceptor support member 36 to rotationally drive the susceptor 10 (20) while supporting it from a lower surface side, a heating apparatus 32 (specifically, for example, halogen lamp) for heating a substrate W to a desired growth temperature during vapor phase growth, a reaction gas introducing pipe 33 for introducing a reaction gas to a region at an upper side of the susceptor 10 (20) in the reaction chamber 31 to supply the reaction gas onto the main surface of the substrate W on the susceptor 10 (20), a purge gas introducing pipe 34 provided on the same side of the reaction gas introducing pipe 33 with respect to the reaction chamber 31, for introducing a purge gas to a region at a lower side of the susceptor 10 (20) in the reaction chamber 31, and an exhaust pipe 35 provided on the opposite side of the purge gas introducing pipe 34 and the reaction gas introducing pipe 33 with respect to the reaction chamber 31, for exhausting gas from the reaction chamber 31.

The susceptor 10 (20) in FIG. 3 only shows an example arrangement.

Next, an epitaxial wafer manufacturing method by using the above-described vapor phase growth apparatus 30 will be explained.

For performing vapor phase growth by using the vapor phase growth apparatus 30, a substrate W is placed on the pocket 11 (upper stage pocket 11a) of the susceptor 10 (20) with its front surface facing upward, and the substrate W on the susceptor 10 (20) is heated by the heating apparatus 32 to a desired growth temperature while supplying reaction gas to the main surface of the substrate W through the reaction gas introducing pipe 33 approximately parallel to the main surface. Then, purge gas is introduced to the lower side of the susceptor 10 (20) through the purge gas introducing pipe 34 approximately parallel to the rear surface of the susceptor. Accordingly, during vapor phase growth, a reaction gas flow is formed in the upper side of the susceptor 10 (20) and a purge gas flow is formed in the lower side thereof, approximately parallel to the susceptor 10 (20) and the substrate W, respectively.

By performing vapor phase growth in this manner, an epitaxial layer is formed on the main surface of the substrate W and an epitaxial wafer can be manufactured.

Hereupon, during vapor phase growth, since the substrate W is heated, dopant inside the substrate W is outdiffused out of the substrate W by the heating to be released in vapor phase.

Just before performing vapor phase growth, for example, vapor phase etching is performed by flowing a hydrogen chloride gas onto a surface of the substrate W to remove natural oxide film of the surface, so that the substrate W is slightly etched to be gasified. Further, the reaction gas contains, for example, hydrogen as a carrier gas as well as a source gas, and the purge gas also uses, for example, hydrogen, so that the substrate W (especially, chamfer 15) is slightly etched by this hydrogen to be gasified. Accordingly, for these reasons as well, dopant in the substrate W is released in vapor phase.

That is, for these several reasons, dopant is to be released in vapor phase from inside of the substrate W in vapor phase growth.

Contrarily, in the susceptor 10 (20) of this embodiment, the pocket 11 has a two-stage structure comprising the upper stage pocket 11a for supporting the outer peripheral edge portion of the substrate W and the lower stage pocket 11b formed on the lower stage on the center side from the upper stage pocket 11a, and the holes 12 penetrating to the rear surface is formed in the lower stage pocket 11b.

Accordingly, dorpant once released from the substrate W into vapor phase during vapor phase growth can properly be released from the lower surface side of the susceptor 10 (20) through the holes 12 formed in the pocket 11, and dopant can be further reliably suppressed to go around to the main surface of the substrate W to be taken into the substrate W again. Therefore, even when an oxide film for preventing autodoping is not formed on the rear surface of the semiconductor substrate, the occurrence of the autodoping can be considerably suppressed. As a result, in-plane uniformity of dopant concentration and resistivity can be performed. That is, in-plane uniformity of dopant concentration and resistivity can be easily obtained.

Moreover, since the holes 12 are set to positions facing the portions on the center side from the outer peripheral end of the substrate W, the holes 12 are positioned in the shadow of the substrate W with respect to air flow formed in the upper side of the substrate W during vapor phase growth. Therefore, inflow of gas on the lower side of the susceptor 10 (20) to the main surface side of the substrate W through the holes 12 can be suppressed. Accordingly, dopant released from inside of the substrate W can be further reliably suppressed to go around to the main surface side of the substrate W. As a result, the occurrence of autodoping can be further properly prevented.

Further, the holes 12 are formed at positions facing the outer peripheral edge portion of the rear surface side of the substrate W, so that dorpant released from inside of the substrate W can be released to the lower side of the susceptor through the holes 12 before going around to the main surface side of the substrate W.

In addition, when the substrate W is placed in the pocket 11 in the state to be supported by the upper stage pocket 11a, there is a slight clearance generated between the rear surface of the substrate W and the lower stage pocket 11b, enabling gas to moderately flow through the clearance. Accordingly, for example, even in the case of the susceptor 10 where the holes 12 are only formed in a portion (for example, outermost peripheral portion) of the lower stage pocket 11b, dorpant released from inside of the substrate W can be reliably released from the lower surface side.

Figure 15B:
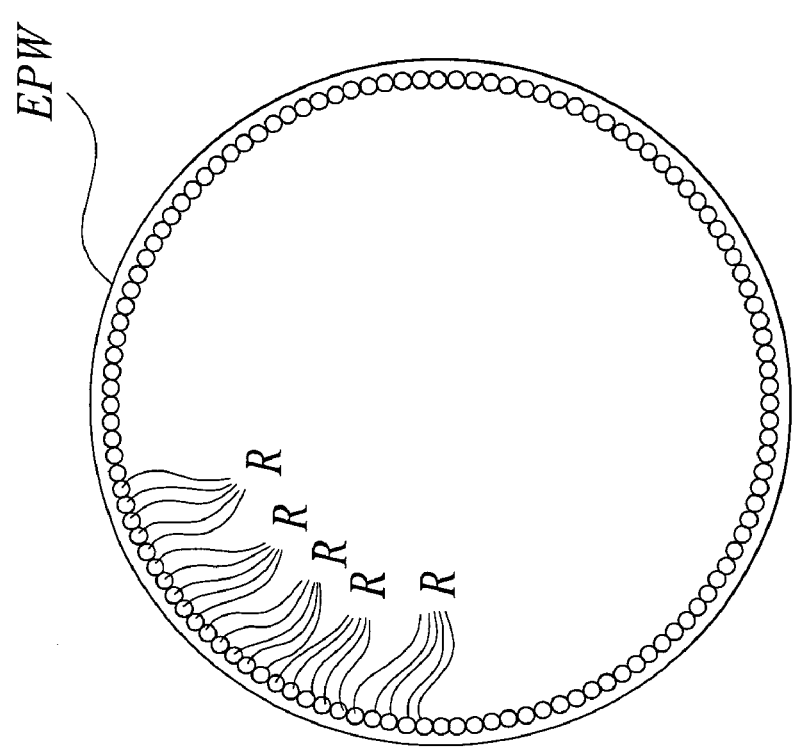
FIG. 15B is a view showing positions of the rising portions formed on the silicon epitaxial wafer to indicate the positional correspondence between the holes of the susceptor and the rising portions of the silicon epitaxial wafer, in comparison with FIG. 15A.
Figure 15A:
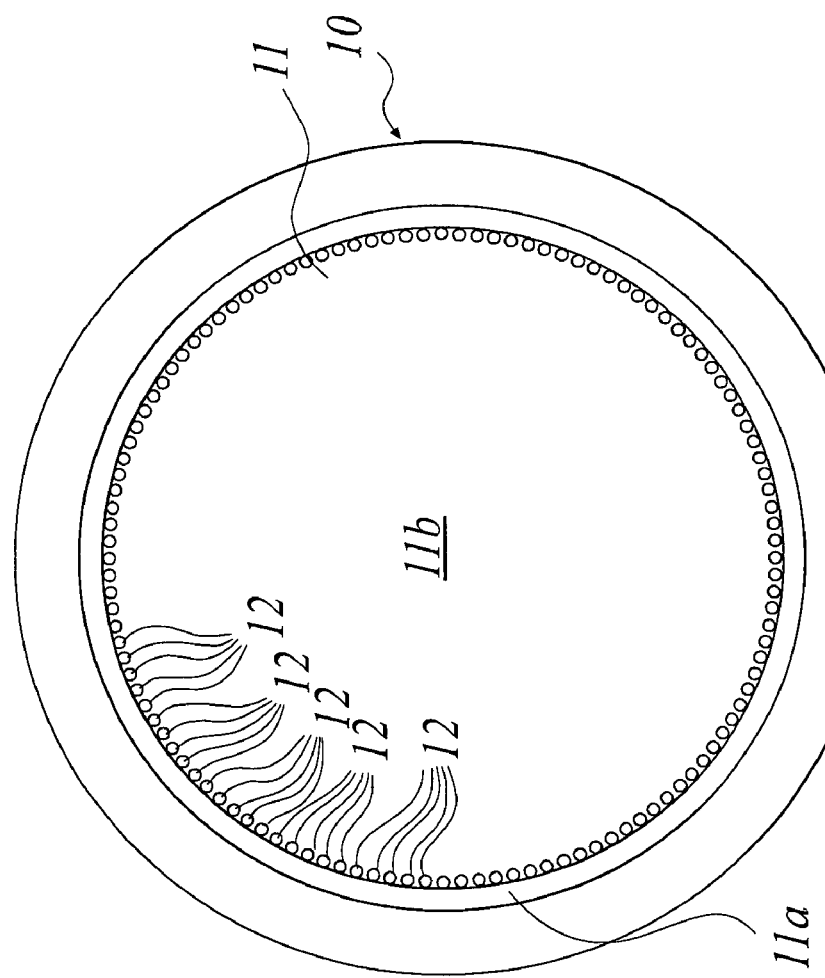
FIG. 15A is a view showing positions of holes of the susceptor to indicate a positional correspondence between the holes of the susceptor and rising portions of a silicon epitaxial wafer.

An epitaxial wafer EPW manufactured by using the susceptor 10 shown in FIG. 15A has a feature that dot-shaped rising portions R rising due to a large film thickness of the epitaxial layer compared to that of a surrounding of the rising portions (in FIG. 15B, only a part of rising portions R is indicated by reference numerals) on the surface of the epitaxial layer as shown in FIG. 15B are formed on all over the circumference of the surface of the epitaxial layer corresponding to the large number of the holes 12 (in FIG. 15A, only a part of the holes 12 is indicated by reference numerals). On the other hand, an epitaxial wafer manufactured by using the susceptor 20 has a feature that the dot-shaped rising portions are formed on all over the surface of the epitaxial layer. The height of the rising portions is about 0.05 μm to 0.1 μm in the case that the thickness of the silicon epitaxial layer is about 6 μm. These epitaxial wafers comprise rising portions on the surface, however, as will be explained, in-plane resistivity (and dopant concentration) distribution becomes excellent.

Figure 4:
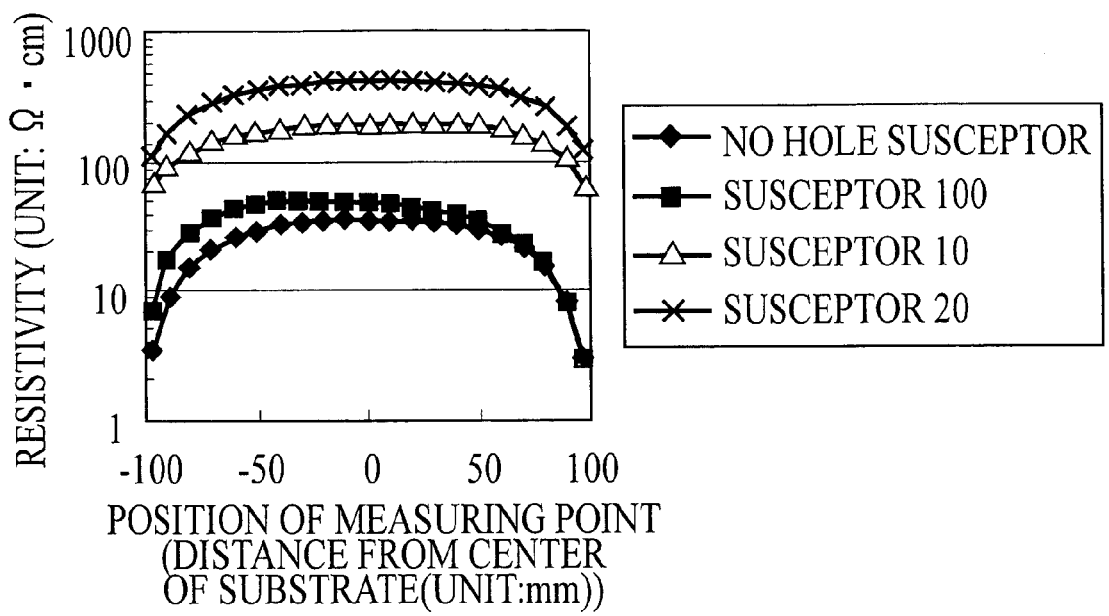
FIG. 4 is a view showing in-plane distribution of resistivity of a silicon epitaxial wafer.
Figure 5:
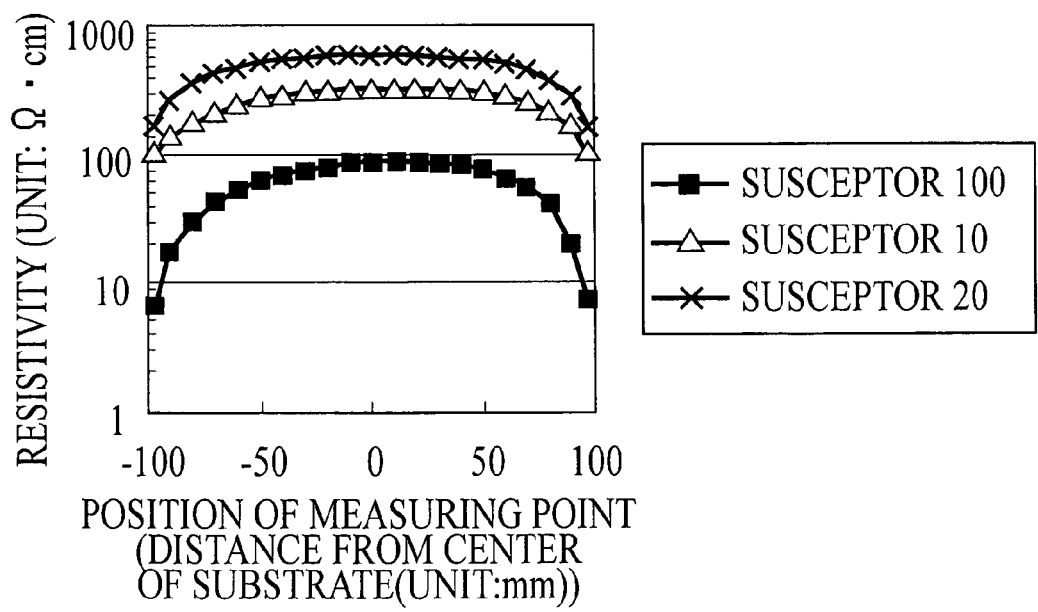
FIG. 5 is a view showing in-plane distribution of resistivity of a silicon epitaxial wafer.
Figure 6:
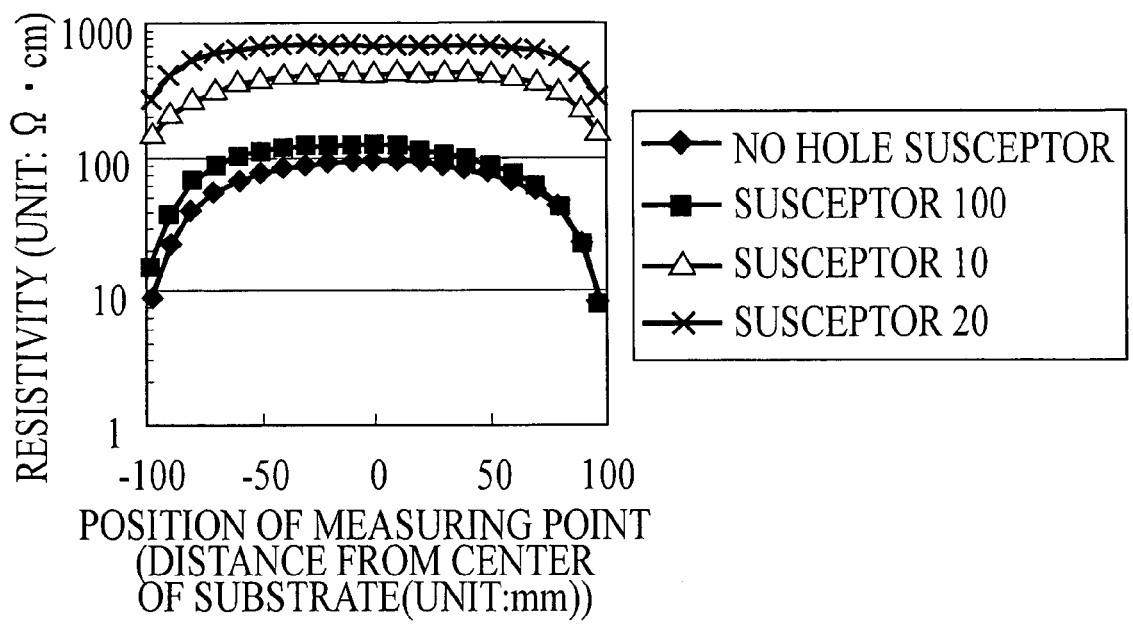
FIG. 6 is a view showing in-plane distribution of resistivity of a silicon epitaxial wafer.

Next, in-plane resistivity (unit: Ω·cm) distributions of silicon epitaxial wafers are shown in FIGS. 4, 5 and 6. Each silicon epitaxial wafer is manufactured by performing vapor phase growth of a silicon epitaxial layer having a thickness of about 6 μm without adding dopant on a main surface of a p$^+$-type silicon single crystal substrate (having no oxide film on a rear surface: hereinafter, referred simply as substrate) in which boron (B) is added in high concentrations by using each of the susceptors 10, 20 in this embodiment, a susceptor 100 (in FIGS. 13A and 13B; to be described later) as a comparative example, and a susceptor which is the same as the susceptor 10 except that the susceptor has no hole (hereinafter, referred as "no hole susceptor"; not shown).

Figure 13A:
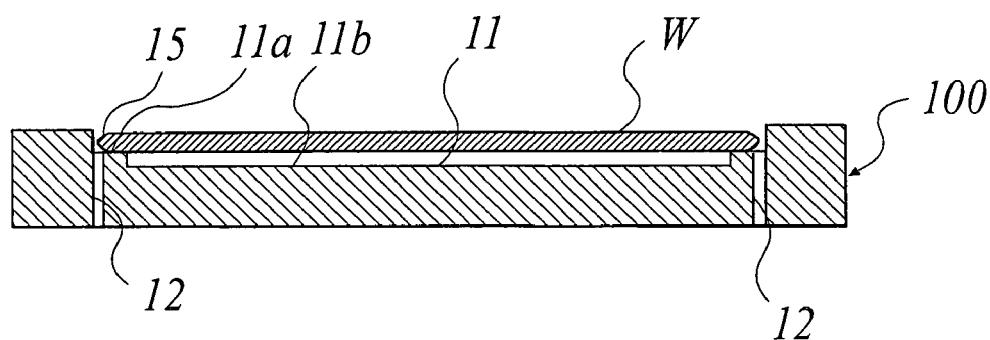
FIG. 13A is a front sectional view showing a susceptor as a comparative example of the susceptor according to this invention.
Figure 13B:
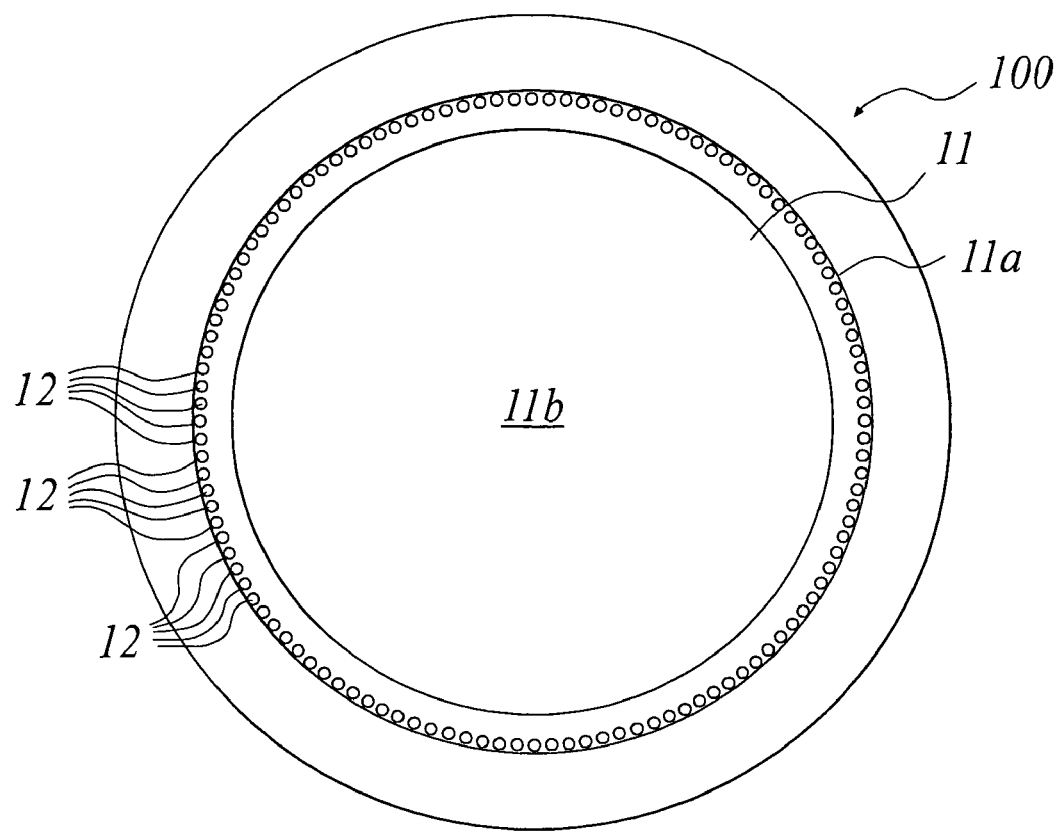
FIG. 13B is a plane view of the susceptor shown in FIG. 13A.

The susceptor 100, as shown in FIGS. 13A and 13B, is the same as the susceptor 10 except arrangement of the holes 12, therefore, the same constitutional elements as those of the susceptor 10 are indicated by the same reference numerals, and description thereof is omitted here. That is, in the susceptor 100, the holes 12 are formed in an outermost peripheral portion of the upper stage pocket 11a or the pocket 11 (in FIG. 13B, only a part of the holes 12 is indicated by the reference numerals).

In FIGS. 4 to 6, FIG. 4 shows the case where resistivity of the substrate is about $7.0 \times 10^{-3}$ Ω·cm to $8.0 \times 10^{-3}$ Ω·cm, FIG. 5 shows the case where resistivity of the substrate is about $1.0 \times 10^{-2}$ Ω·cm to $1.1 \times 10^{-2}$ Ω·cm (in FIG. 5, data in a case of using the no hole susceptor is omitted), and FIG. 6 shows the case where resistivity of the substrate is about $1.4 \times 10^{-2}$ Ω·cm to $1.5 \times 10^{-2}$ Ω·cm.

As shown in FIGS. 4 to 6, in the case of using the susceptor 100 in which the holes 12 are formed in the outermost peripheral portion of the pocket 11, it shows resistivity and distribution tendency having almost no difference in comparison to the case of using the no hole susceptor, and there is seen a significant decrease of resistivity on the peripheral edge portion of the substrate compared to those of the center of the substrate in all cases.

Contrary to this, in the case of using the susceptor 10, 20, resistivity is significantly increased in comparison to the case of using the susceptor 100 or the no hole susceptor. In addition, decrease of resistivity at the epitaxial layer peripheral edge portion compared to the center can significantly be reduced, so that it is found out that in-plane uniformity of resistivity can be performed. This indicates obviously that in the case of using the susceptor 10, 20, autodoping in which dopant released goes around to the main surface of the substrate to be taken into the substrate again can be suppressed in comparison to the case of using the no hole susceptor or the susceptor 100.

Figure 7:
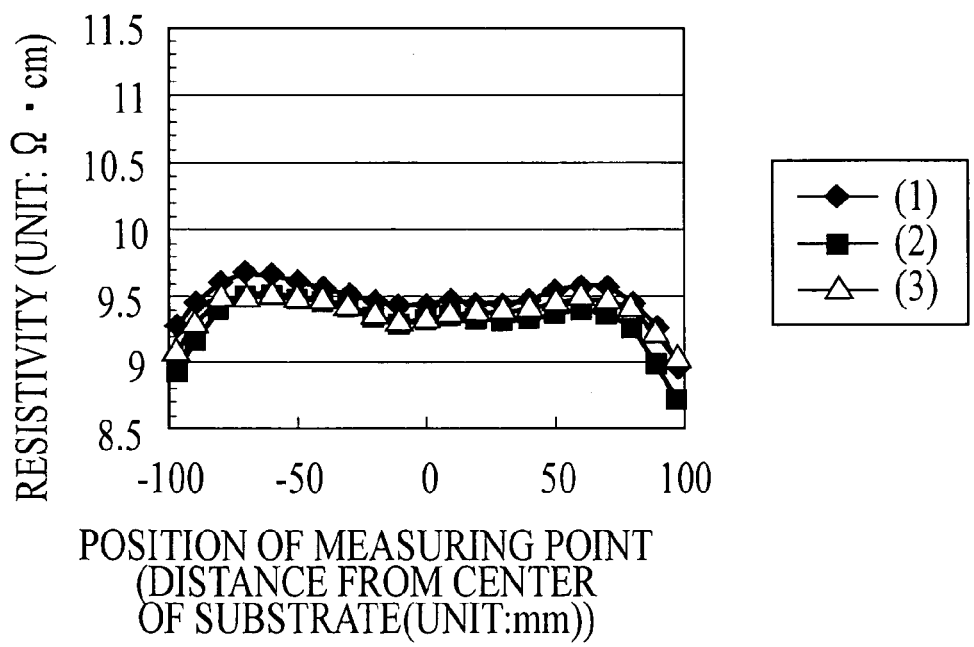
FIG. 7 is a view showing in-plane distribution of resistivity of a silicon epitaxial wafer.

Next, in-plane resistivity distributions of silicon epitaxial wafers with resistivity of about 9.5 Ω·cm are shown in FIG. 7. Each silicon epitaxial wafer is manufactured by performing vapor phase growth of a p-type silicon epitaxial layer with boron (dopant) added to have a thickness of about 6 μm on each main surface of (1) a silicon single crystal substrate with resistivity of about $7.0 \times 10^{-3}$ Ω·cm to $8.0 \times 10^{-3}$ Ω·cm, (2) a silicon single crystal substrate with resistivity of about $1.0 \times 10^{-2}$ Ω·cm to $1.1 \times 10^{-2}$ Ω·cm, and (3) a silicon single crystal substrate with resistivity of about $1.4 \times 10^{-2}$ Ω·cm to $1.5 \times 10^{-2}$ Ω·cm (each silicon single crystal substrate is added with boron (B), and has no oxide film on a rear surface; hereinafter referred simply as substrate) by using the susceptor 20 of this embodiment.

As shown in FIG. 7, there is almost no difference of in-plane resistivity distributions in the epitaxial layers according to the difference of resistivity of the substrate in (1) to (3), and it is found out that autodoping can be reduced.

As described above, according to the susceptor 10, 20 in this embodiment, the vapor phase growth apparatus 30 comprising the susceptor 10, 20, and the epitaxial wafer manufacturing method using the vapor phase growth apparatus 30, since dopant outdiffused from inside of the substrate W by heating in vapor phase growth, or released mainly from the chamfer 15 of the substrate W by vapor phase etching can be properly released from the lower surface side of the susceptor 10 (20) through the holes 12 formed in the center side from the outermost peripheral portion of the pocket 11 of the susceptor 10 (20), dopant can reliably be suppressed to go around to the main surface of the substrate W. Therefore, the occurrence of autodoping can significantly be prevented without forming an oxide film for preventing autodoping on the rear surface of the substrate W. As a result, in-plane uniformity of dopant concentration and resistivity can be performed. That is, in-plane uniformity of dopant concentration and resistivity can be easily obtained.

<Modification 1>

Figure 8A:
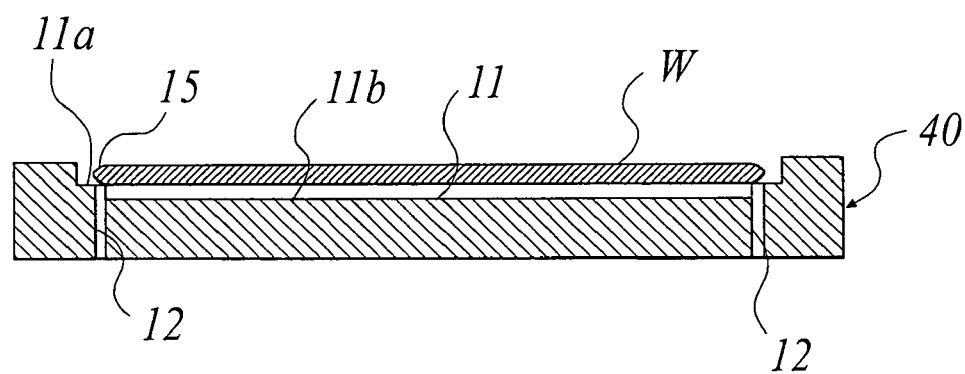
FIG. 8A is a front sectional view showing an example of a susceptor according to this invention.
Figure 8B:
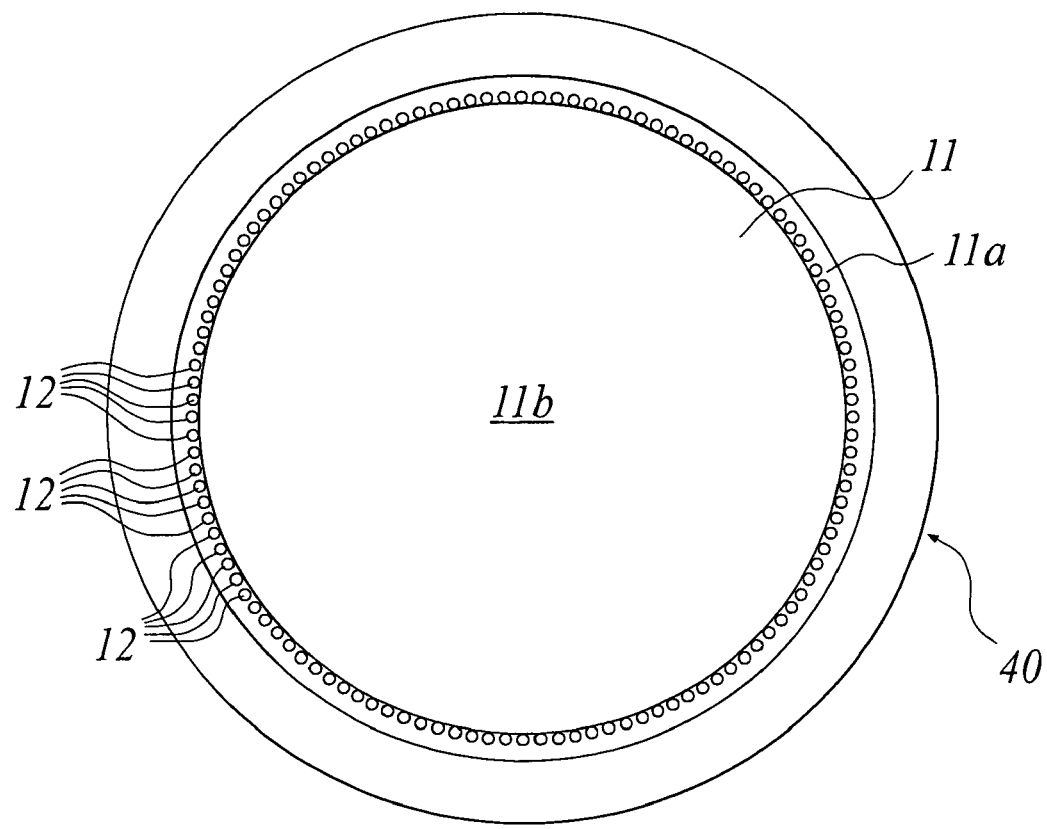
FIG. 8B is a plane view of the susceptor shown in FIG. 8A.

In the above description, only the susceptors 10, 20 in each of which the holes 12 are formed in the lower stage pocket 11b in the upper stage pocket 11a and the lower stage pocket 11b were explained, however, for example as shown in FIGS. 8A and 8B, it may be a susceptor 40 in which the holes 12 are formed in the upper stage pocket 11a.

The susceptor 40, as will be explained below, is the same as the above described susceptor 10 except arrangement of the holes 12, therefore, the same constitutional elements as those of the susceptor 10 are indicated by the same reference numerals, and description thereof is omitted here.

That is, the holes 12 are formed at positions facing the rear surface of chamfer 15 of the substrate W (but the positions are in the center side from outer peripheral end of substrate W) in the upper stage pocket 11a of the susceptor 40 (in FIG. 8B, only a part of the holes is indicated by the reference numerals).

According to the modification 1, dopant released from the chamfer 15 which is subjected to vapor phase etching the most in the process of vapor phase growth can be released to the lower side of the susceptor 40 through the holes 12, so that the occurrence of autodoping can be reliably prevented.

Moreover, since the holes 12 are set to positions facing the portion on the center side from the peripheral end of the substrate W, the holes 12 are positioned in the shadow of the substrate W with respect to air flow formed in the upper side of the substrate W in vapor phase growth. Thus, inflow of gas of the lower side of the susceptor 10 (20) to the main surface of the substrate W through the holes 12 can be suppressed. Accordingly, gas including dopant released from the substrate W can be also suppressed to go around to the upper side of the substrate W.

<Modification 2>

In the above description, only the susceptors 10, 20, 40 in each of which the two-stage structure having the upper stage pocket 11a and the lower stage pocket 11b is formed were explained, however, this invention is not limited thereto. In short, it may be, for example as shown in FIGS. 9 and 10, a susceptor 50 or 60 in which the pocket 11 has only one stage as long as the holes 12 are arranged on the center side from the outermost peripheral portion of the pocket 11.

Figure 9:
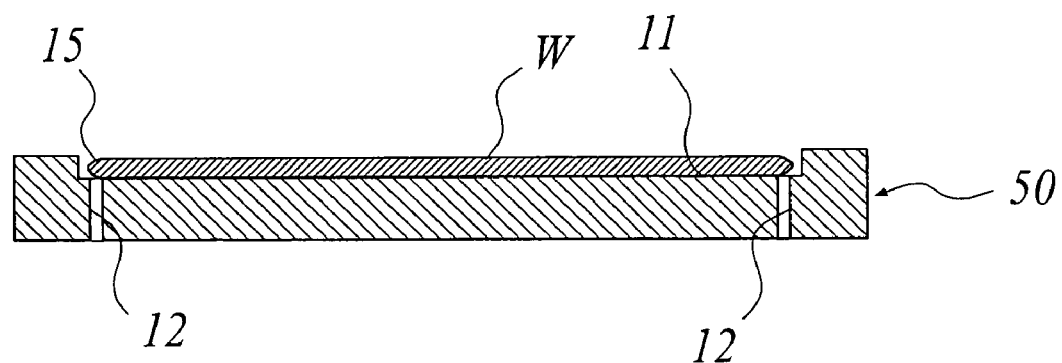
FIG. 9 is a front sectional view showing an example of a susceptor according to this invention.
Figure 10:
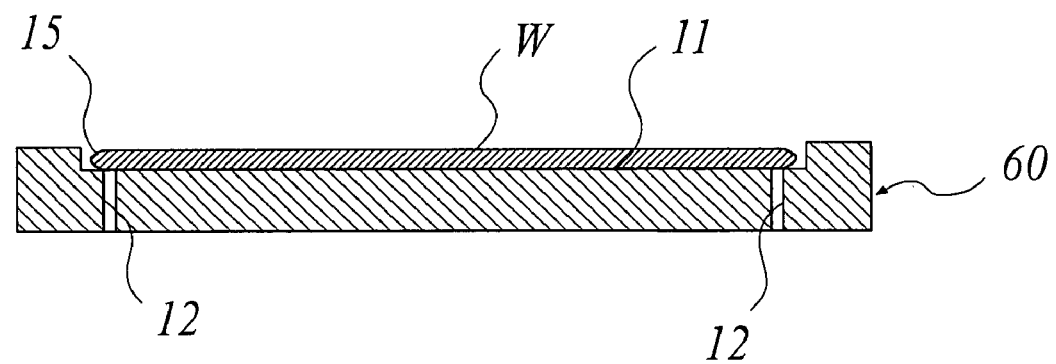
FIG. 10 is a front sectional view showing an example of a susceptor according to this invention.

In this case, as shown in FIG. 9, the large number of holes 12 may be formed at positions facing the rear surface of the chamfer 15, or as shown in FIG. 10, for example, the large number of holes 12 may be formed at positions facing the rear surface of the substrate W on the center side from the chamfer 15.

Specially, in the former case, dopant released from the chamfer 15 which is subjected to vapor phase etching the most in the process of vapor phase growth can be released to the lower side of the susceptor 50 through the holes 12, so that the occurrence of autodoping can be reliably prevented.

Further, in the case that the pocket 11 has only one stage, for example as shown in FIGS. 9 and 10, the large number of holes 12 may be formed in a circumference having a center almost equal to that of the pocket 11, or may be formed in all over the surface of pocket 11, which is not shown.

<Modification 3>

In the above description, the examples in which each hole 12 has a cylindrical shape were explained, however, it may have a tube shape such as, for example, a cross section of a hole is rectangle other than a cylindrical shape. Also, this invention is not limited thereto. For example, as a susceptor 70 shown in FIGS. 11A and 11B, each hole 12 may have a slit shape.

The susceptor 70, as will be explained below, is the same as the above described susceptor 10 except the shape of the holes 12, therefore, the same constitutional elements as those of the susceptor 10 are indicated by the same reference numerals, and description thereof is omitted here.

Figure 11A:
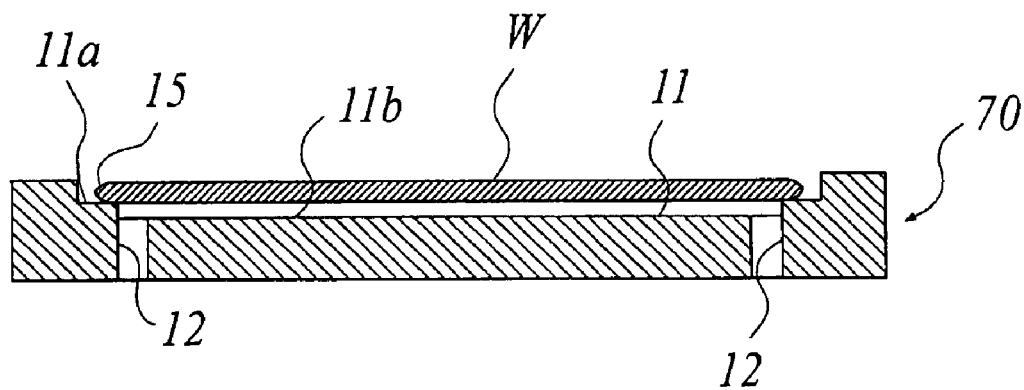
FIG. 11A is a front sectional view showing an example of a susceptor according to this invention.
Figure 11B:
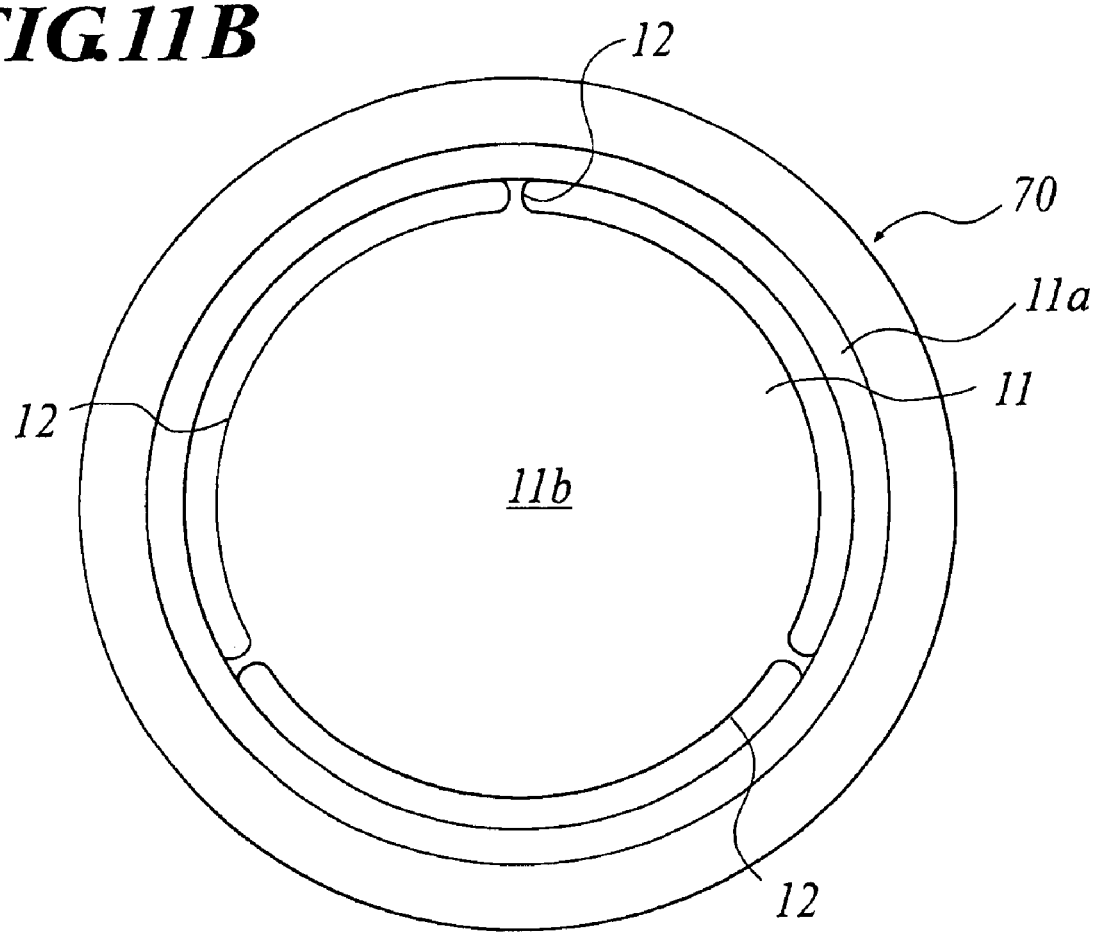
FIG. 11B is a plane view of the susceptor shown in FIG. 11A.

In the modification 3, for example as shown in FIGS. 11A and 11B, the holes 12 are formed in a slit shape (that is, circular arc shape) in the lower stage pocket 11b (for example, outermost peripheral portion) along a circumference having a center almost equal to that of the pocket 11, and a plurality of the holes 12 are arranged at equal intervals in the circumference.

Although, it is omitted from the drawings, a plurality of slit-shaped holes 12 may be formed along a plurality of concentric circles having a center almost equal to that of the pocket 11.

The slit-shaped hole may be employed to a susceptor in which the pocket 11 has only one stage.

An epitaxial wafer manufactured by using the susceptor 70 has a feature that circular-arc-shaped rising portions rising due to a large film thickness in comparison to that of the surrounding of the rising portions are formed at a portion corresponding to each hole 12 on a surface of an epitaxial layer. The height of the rising portions are about 0.05 μm to 0.1 μm in the case that the thickness of the silicon epitaxial layer is about 6 μm.

<Modification 4>

Figure 12A:
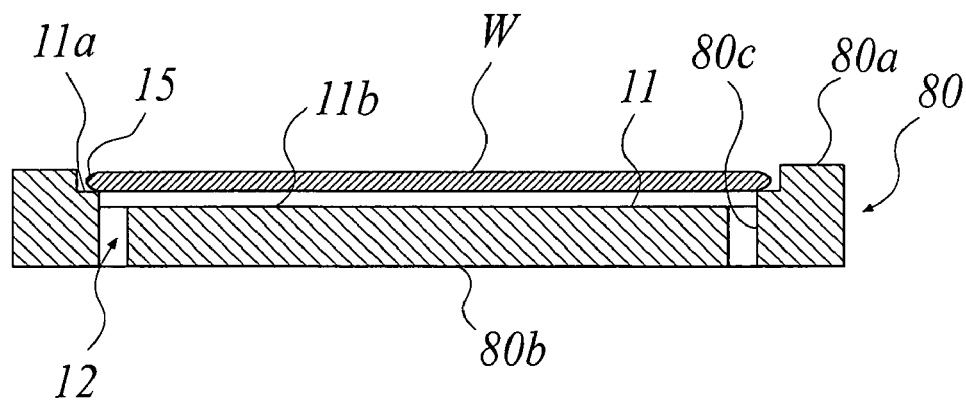
FIG. 12A is a front sectional view showing an example of a susceptor according to this invention.
Figure 12B:
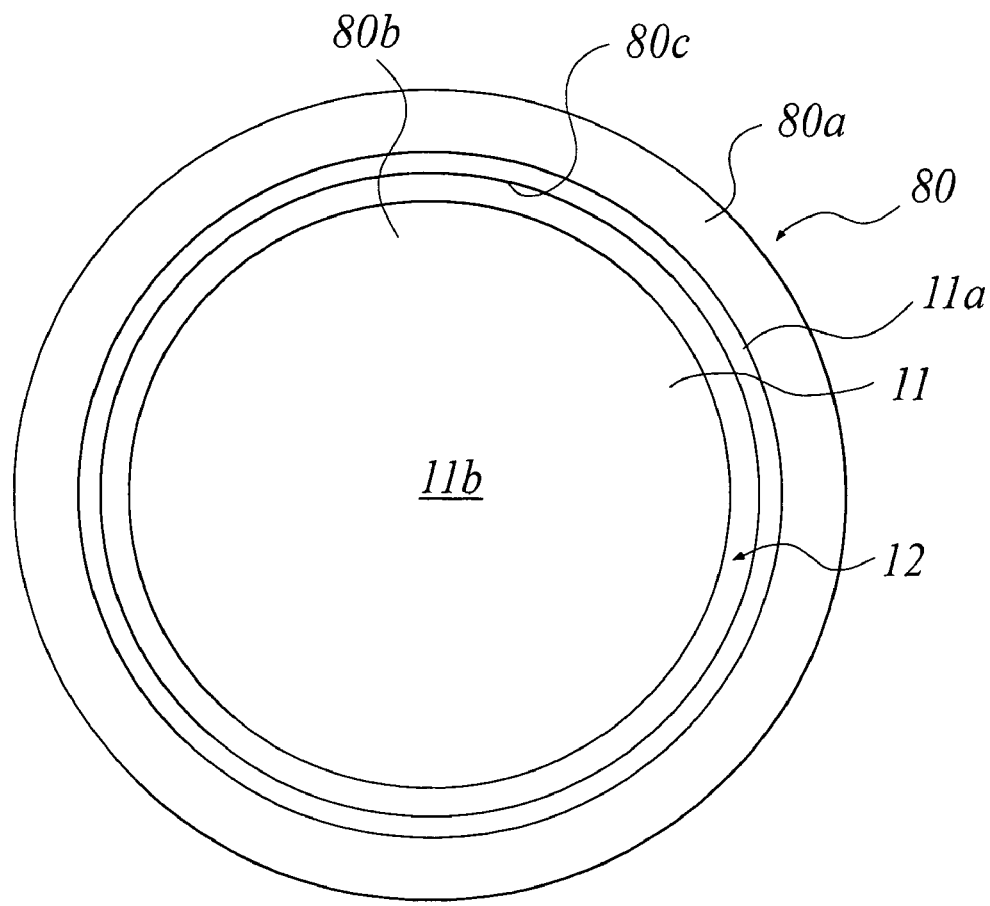
FIG. 12B is a plane view of the susceptor shown in FIG. 12A.

In the above description, the examples in which each holes 12 has a cylindrical shape or a slit shape were explained, however, this invention is not limited thereto. For example, as a susceptor 80 shown in FIGS. 12A and 12B, hole 12 may have an annular shape.

The susceptor 80 is the same as the above described susceptor 10 except a point which will be explained below, therefore, the same constitutional elements as those of the susceptor 10 are indicated by the same reference numerals, and description thereof is omitted here.

The susceptor 80 has a divided structure of, for example, an outer peripheral side portion 80a having the upper stage pocket 11a or the like and an inner peripheral side portion 80b which composes the lower stage pocket 11b. Hereupon, the inside diameter of an opening portion 80c at the center of the outer peripheral side portion 80a is set to be larger than the outside diameter of the inner peripheral side portion 80b.

The inner peripheral side portion 80b is arranged inside of the opening portion 80c of the outer peripheral side portion 80a so as not to contact with an inner peripheral wall of the opening portion 80c, so that an annular-shaped hole 12 is formed between the inner peripheral side portion 80b and the outer peripheral side portion 80a. Vapor phase growth performed by using the susceptor 80 of this structure is successful in suppressing the occurrence of autodoping same as described above.

The annular-shaped hole 12 formed by the same manner as the susceptor 80 may be employed for a susceptor in which the pocket 11 has only one stage.

An epitaxial wafer manufactured by using the susceptor 80 has a feature that an annular-shaped rising portion rising due to a large film thickness in comparison to that of the surrounding of the rising portion is formed at a portion corresponding to the hole 12 on a surface of an epitaxial layer. The height of the rising portion is about 0.05 μm to 0.1 μm in the case that the thickness of the silicon epitaxial layer is about 6 μm.

SECOND EMBODIMENT

In the above described first embodiment, it was explained that the rising portions rising due to a large film thickness in comparison to that of the surrounding of the rising portions are formed at portions corresponding to the holes 12 of the susceptor 10, 20, 40, 50, 60, 70 or 80 on the surface of the epitaxial layer of the epitaxial wafer manufactured by using the susceptor 10 to 80, however, it was found out that the size of the rising portions can be controlled by adjusting the inside diameter or inside width of the holes 12.

Thus, in this embodiment, an example to control the size of rising portions formed due to a large film thickness in comparison to that of the surrounding of the rising portions on a surface of an epitaxial layer of an epitaxial wafer to be manufactured by adjusting the inside diameter of the holes 12 of a susceptor will be explained.

Figure 14:
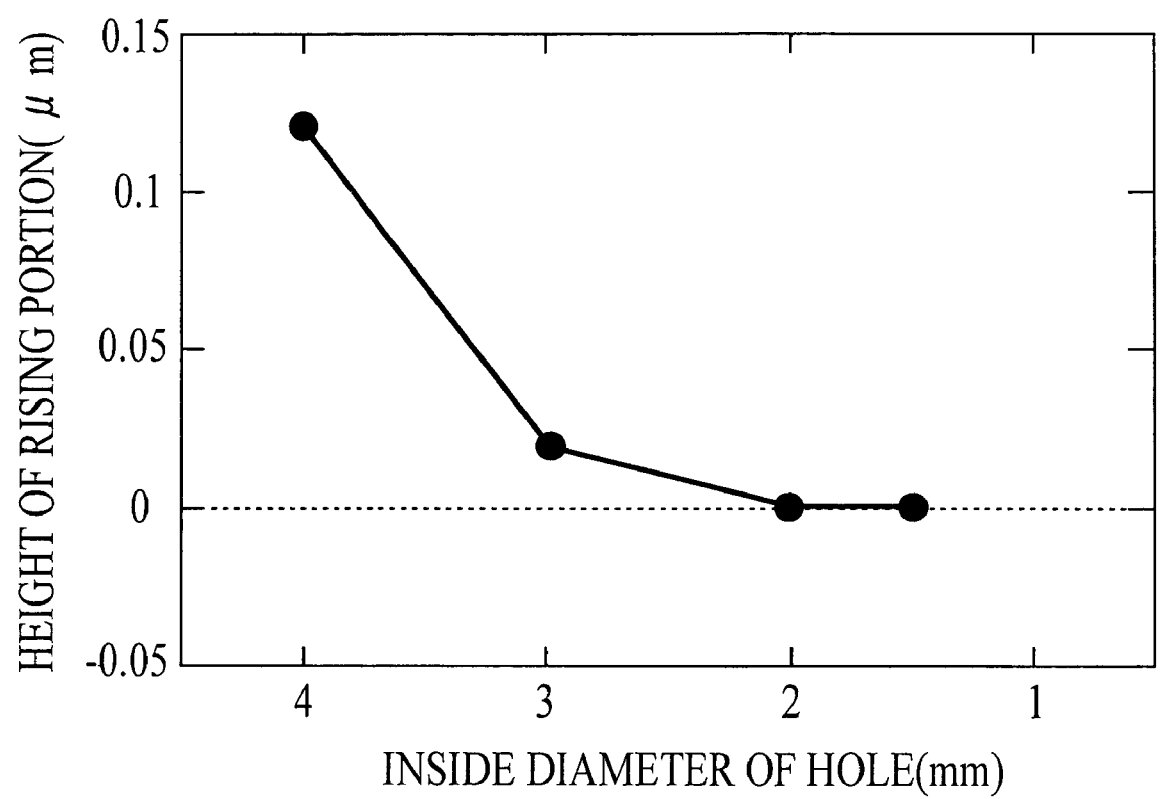
FIG. 14 is a view showing relation between inside diameter of a hole of the susceptor and height of a rising portion.

First, FIG. 14 shows relation between inside diameter (diameter) of a cylindrical-shaped hole 12 of the susceptor 10 and height of a rising portion in the case of manufacturing an epitaxial wafer by using the susceptor 10.

As shown in FIG. 14, when the inside diameter of the hole 12 of the susceptor 10 is 4 mm, the height of the rising portion becomes 0.1 µm or more. Contrary to this, when the inside diameter of the hole 12 of the susceptor 10 is changed to 3 mm, the height of the rising portion can be reduced to less than 0.05 µm (specifically, about 0.02 µm). That is, by setting the inside diameter of the cylindrical-shaped hole 12 of the susceptor 10 to be 3 mm or less, the rising portion can be extremely small.

Further, as shown in FIG. 14, when the inside diameter of the cylindrical-shaped hole 12 of the susceptor 10 is changed to 2 mm, the height of the rising portion becomes substantially "0". That is, by setting the inside diameter of the cylindrical-shaped hole 12 of the susceptor 10 to be 2 mm or less, the occurrence of the rising portion can be substantially prevented.

Also, when the inside diameter of the cylindrical-shaped hole 12 of the susceptor 10 is changed to 1.5 mm, as shown in FIG. 14, the height of the rising portion becomes smaller, however, the heights are substantially "0" in both cases.

As described above, according to this embodiment, the size of the rising portions formed due to a large film thickness in comparison to that of the surrounding of the rising portions on the surface of the epitaxial layer of the epitaxial wafer to be manufactured can be controlled by adjusting the inside diameter or the inside width of the holes 12 of the susceptor 10.

Further, the inside diameter of the cylindrical-shaped holes 12 of the susceptor 10 are preferably 3 mm or less, thereby rising portions formed can extremely be small (for example, less than 0.05 µm in height).

Furthermore, the inside diameter of the cylindrical-shaped holes 12 of the susceptor 10 are more preferably 2 mm or less, thereby the occurrence of the rising portion can substantially be prevented.

The embodiment is not limited to the susceptor 10, and the susceptor 20, 40, 50, 60, 70, 80 or the like can also be used to control the height of the rising portions by adjusting the holes 12 of the susceptor (inside diameter in the case of the cylindrical-shaped hole 12, and inside width in the case of the slit-shaped or annular-shaped hole 12) in the same manner.

In the above described each embodiment, only the example in which vapor phase growth of a p-type silicon epitaxial layer is performed on a $P^+$-type silicon single crystal substrate is explained, however, the susceptor, vapor phase growth apparatus and the epitaxial wafer manufacturing method in this invention may be applied to the cases of, for example, performing vapor phase growth of a n-type silicon epitaxial layer on a $n^+$-type silicon single crystal substrate added with As, performing vapor phase growth of a p-type silicon epitaxial layer on a $n^+$-type silicon single crystal substrate, performing vapor phase growth of a n-type silicon epitaxial layer on a $p^+$-type silicon single crystal substrate or the like. In these cases also, in-plane uniformity of resistivity (dopant concentration) can be performed.

It is explained that the example was made for applying this invention only to the susceptor of a single wafer type, however, it is not limited thereto. This invention may be applied to a batch process susceptor.

Further, this invention may be applied to a susceptor of a lift pin type. That is, a hole for penetrating a lift pin may also be formed in a pocket of a susceptor in addition to the holes 12 of this invention.

THIRD EMBODIMENT

First, an epitaxial wafer manufacturing apparatus 110 of a single wafer type will be explained as an example of an epitaxial wafer manufacturing apparatus of this invention referring to FIGS. 18 and 19.

The epitaxial wafer manufacturing apparatus 110 comprises a susceptor 120 (to be described in detail later), a reaction chamber 111 in which the susceptor 120 is disposed, a susceptor support member 112 to rotationally drive the susceptor 120 and move the susceptor 120 up and down while supporting it, lift pins 113 provided to penetrate from front to rear of the susceptor 120 to be capable of going up and down with respect to the susceptor 120, for attaching or detaching the substrate W to or from the susceptor 120 with the going up or down operation, in a state of supporting the substrate W, heating apparatuses 114a, 114b (specifically, for example, halogen lamp) for heating the substrate W to a desired temperature in vapor phase growth, a vapor phase growth gas introducing pipe 115 for introducing gas for vapor phase growth including a source gas (specifically, for example, trichlorosilane or the like) and a carrier gas (specifically, for example, hydrogen or the like) to the region in the upper side of the susceptor 120 in the reaction chamber 111 to supply the gas on the main surface of the substrate W on the susceptor 120, a purge gas introducing pipe 116 provided on the same side of the vapor phase growth gas introducing pipe 115 with respect to the reaction chamber 111, for introducing a purge gas (specifically, for example, hydrogen or the like) to the region in the lower side of the susceptor 120 in the reaction chamber 111, and an exhaust pipe 117 provided on the opposite side of the purge gas introducing pipe 116 and the vapor phase growth gas introducing pipe 115 with respect to the reaction chamber 111, for exhausting gas (vapor phase growth gas and purge gas) from the reaction chamber 111.

The susceptor 120 is for supporting the semiconductor substrate W (hereinafter, sometimes simply referred as a substrate), and made from, for example, graphite coated with silicon carbide.

Figure 16A:
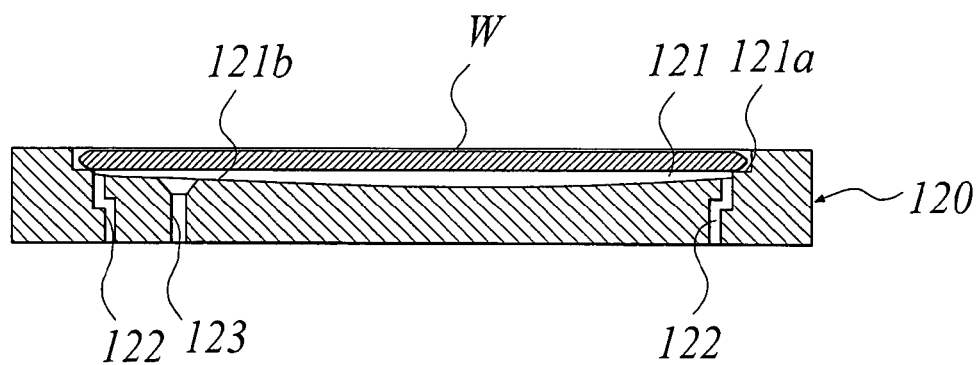
FIG. 16A is a front sectional view showing an example of a susceptor according to this invention.
Figure 16B:
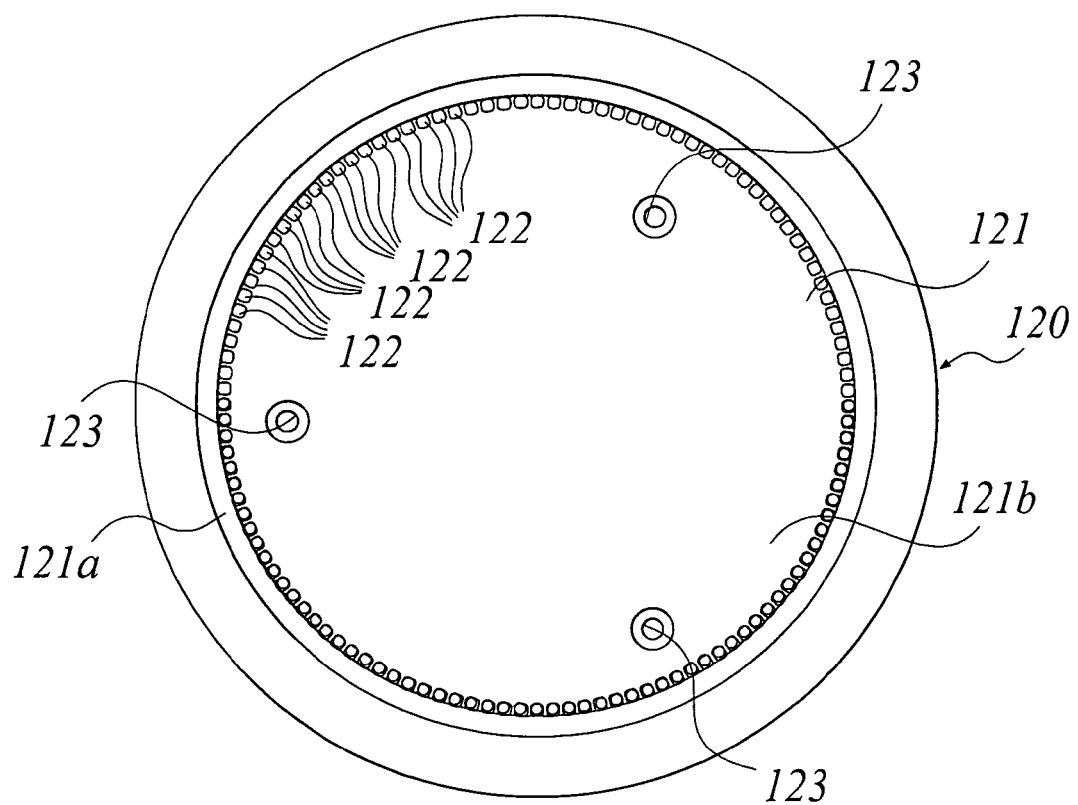
FIG. 16B is a plane view of the susceptor shown in FIG. 16A.

As shown in FIGS. 16A and 16B, the susceptor 120 is formed in an approximately disk shape, and a pocket 121 (concavity portion with a round shape in plain view) is formed on the main surface for positioning the substrate W thereon.

The pocket 121 has a two-stage structure having an annular-shaped (refer to FIG. 16B) outer peripheral side portion 121a for supporting the outer peripheral edge portion of the substrate W in the state shown in FIG. 16A, and an inner peripheral side portion 121b having a round shape in plain view, which is concave downward from the outer peripheral side portion 121a at the inside thereof. The outer peripheral side portion 121a is formed, for example, in approximately flat, and the inner peripheral side portion 121b is formed in a concave curved shape.

For example, in the inner peripheral side portion 121b of the susceptor 120, there are formed through holes 122 penetrating to the rear surface of the susceptor 120. That is, the susceptor 120 comprises the through holes 122 penetrating from the surface for supporting the substrate W to the rear surface.

Figure 17A:
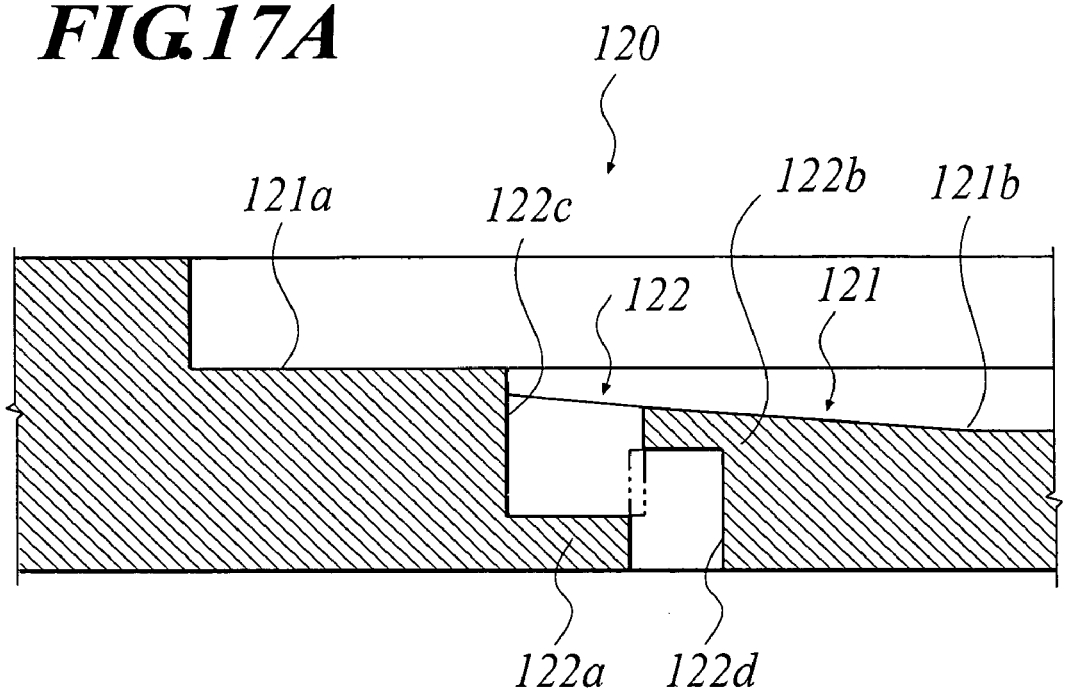
FIG. 17A is an enlarged front sectional view of a main portion of the susceptor shown in FIG. 16A.
Figure 17B:
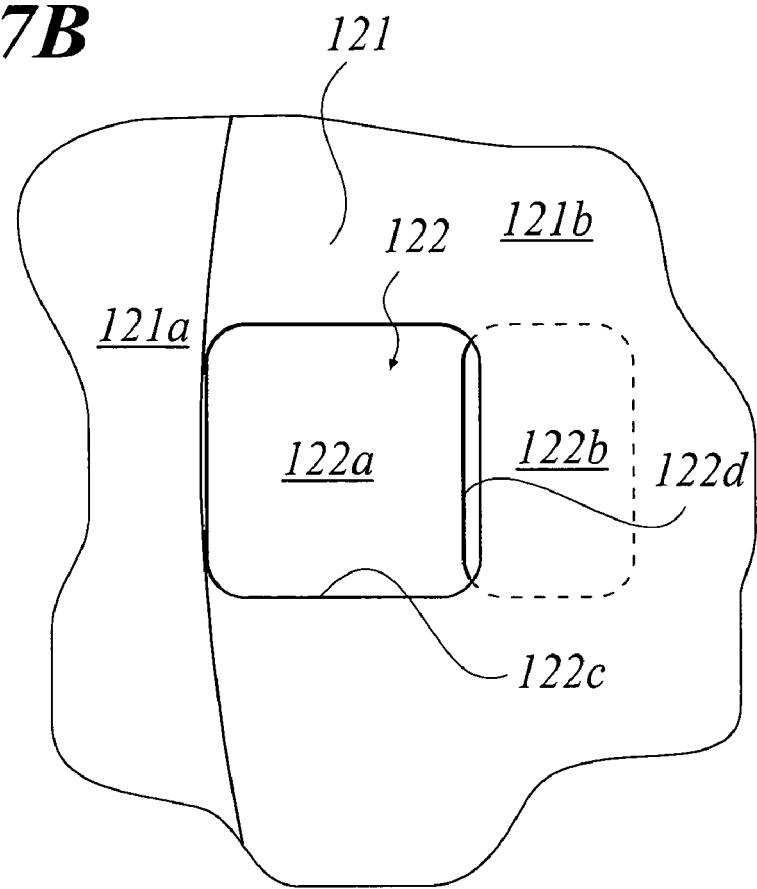
FIG. 17B is an enlarged plane view of a main portion of the susceptor shown in FIG. 16A.

Each through hole 122 comprises overheat suppressing portions 122a, 122b (refer to FIGS. 17A and 17B) for suppressing local overheating of the substrate W by preventing direct heat radiation through the through hole 122 from the heat source (specially, the heating apparatus 114b in the heating apparatuses 114a, 114b) for heating the substrate W supported by the susceptor 120 through the susceptor 120 from the rear surface side.

More specifically, for example, at the inner peripheral side portion 121b of the susceptor 120, there are formed holes 122c, 122d from the surface for supporting the substrate W and the rear surface thereof, respectively, being shifted in relation to each other for partially overlapping with each other (in a direction perpendicular to the surface of the susceptor 120). Each of the holes 122c, 122d does not penetrate the susceptor 120, however, they are formed to have a depth to communicate with each other inside the susceptor 120. As a result, the through hole 122 is formed by the combination of the holes 122c, 122d. In the susceptor 120, a bottom portion of the hole 122c forms the overheat suppressing portion 122a, and a bottom portion of the hole 122d forms the overheat suppressing portion 122b.

More specifically, the through holes 122 are formed, for example, in the outermost peripheral portion of the inner peripheral side portion 121b. Also, for example, the hole 122c formed from the surface for supporting the substrate W is positioned in the outer peripheral side of the susceptor 120 from the hole 122d formed from the rear surface.

Further, as shown in FIG. 16B, a large number of through holes 122 are arranged, for example, at equal intervals in a circumference having a center almost equal to that of the pocket 121 (in FIG. 16B, only a part of the through holes 122 is indicated by the reference numerals). That is, the large number of through holes 122 are formed in all over the circumference having a center almost equal to that of the pocket 121.

As shown in FIGS. 16A and 16B, lift pin through holes 123 are formed in the inner peripheral side portion 121b of the pocket 121 of the susceptor 120 in the state of penetrating to the rear surface of the susceptor 120, and the lift pin 113 penetrates through the lift pin through hole 123.

For example, the lift pin through holes 123 are arranged at three positions at a uniform angle in the circumference having a center almost equal to that of the pocket 121.

Figure 18:
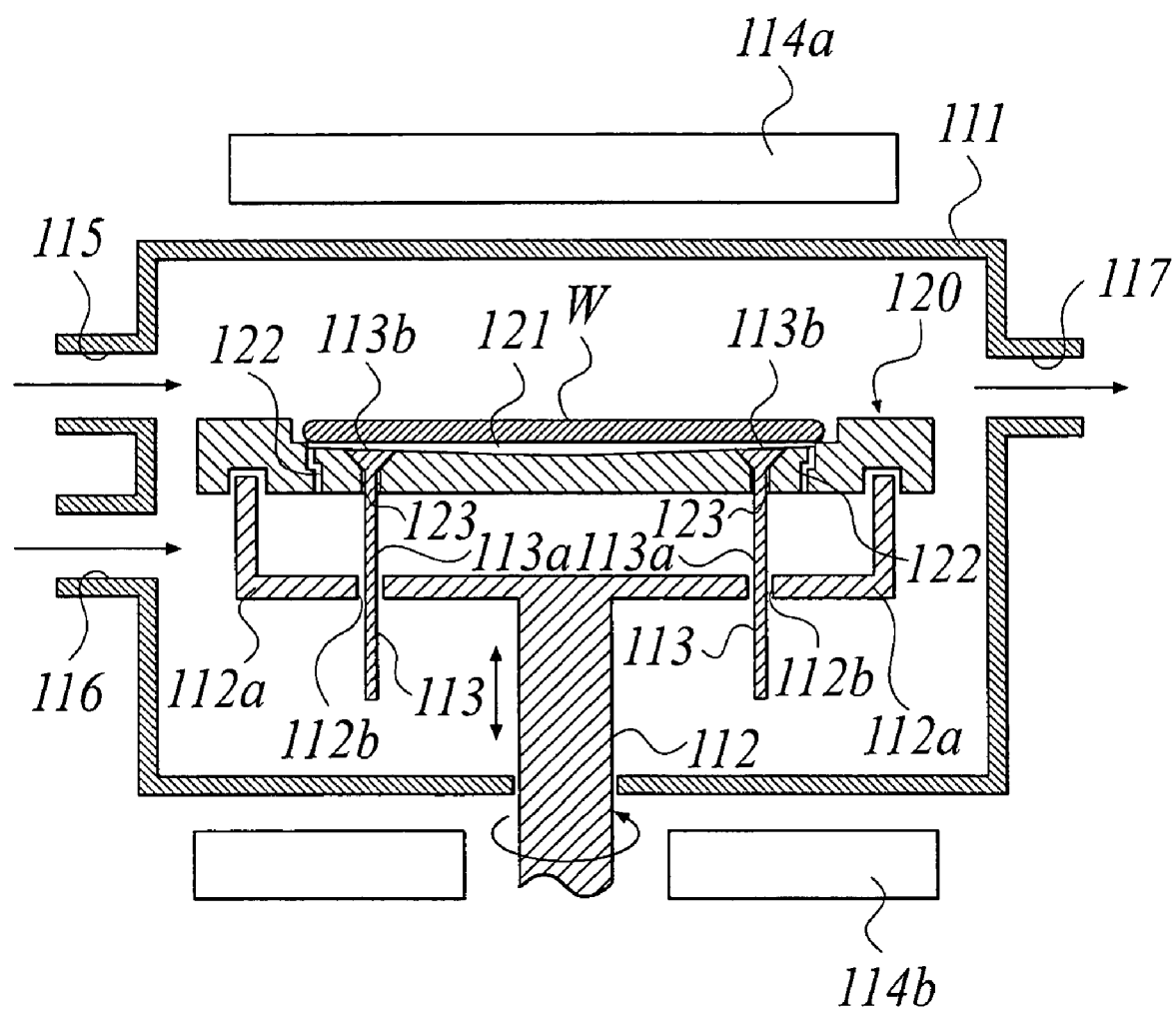
FIG. 18 is a schematic front sectional view showing a preferred example of an epitaxial wafer manufacturing apparatus according to this invention and particularly shows a state during vapor phase growth.

Hereupon, for example as shown in FIG. 18, the lift pin 113 comprises a body part 113a formed in a round bar shape, and a head part 113b formed on an upper end of the body part 113a to support the substrate W from the lower surface side. The head part 113b has diameter larger than that of the body part 113a to easily support the substrate W. The lift pin 113 is inserted into the lift pin through hole 123 from the lower end part thereof, therefore the head part 113b is retained by the edge of the lift pin through hole 123 to be supported by the susceptor 120, and the body part 113a is suspended from the lift pin through hole 123. The body part 113a of the lift pin 113 further penetrates the through hole 112b provided in a support arm 112a of the susceptor support member 112.

The susceptor support member 112 radially comprises a plurality of support arms 112a (FIG. 18 or the like), which support the susceptor 120 from the lower surface side, thereby keeping the upper surface of the susceptor 120 in an approximately horizontal condition.

The epitaxial wafer manufacturing apparatus 110 is composed as described above.

By performing vapor phase growth with the epitaxial wafer manufacturing apparatus 110, a silicon epitaxial layer is formed on the main surface of the substrate W to manufacture a silicon epitaxial wafer.

First, it is made to support the substrate W by the susceptor 120 inside the reaction chamber 111.

For this purpose, first, each lift pin 113 is gone up relative to the susceptor 120 to project approximately equal length to one another above the upper surface of the susceptor 120, thereby the substrate W is transferred onto the lift pins 113. In this case, the susceptor 120 is gone down as the susceptor support member 112 is gone down. In this going down process, for example, after the lower end of each lift pin 113 reaches a bottom surface of the inside of the reaction chamber 111, the lift pins 113 do not go down any more, however, the susceptor 120 continues to go down. Therefore, the lift pins 113 go up relative to the susceptor 120, and finally becomes the state where no substrate W presents in FIG. 19.

Next, the substrate W is carried into the reaction chamber 111 by a handler which is not shown, and the head parts 113b of each lift pins 113 after the projection operation support the substrate W with the main surface thereof upward.

Next, for making the susceptor 120 support the substrate W, each lift pin 113 is gone down relative to the susceptor 120. Therefore, the susceptor 120 is gone up as the susceptor support member 112 is gone up as well as removing the handler. In this going up process, when the outer peripheral side portion 121a of the pocket 121 reaches the rear surface of the substrate W, the substrate W which was supported by the head parts 113b of the lift pins 113 moves into the state to be supported by the outer peripheral side portion 121a of the pocket 121. Further, when the edge of each lift pin through hole 123 reaches the head part 113b of the lift pin 113, the lift pins 113 which were supported by the bottom surface of the inside of the reaction chamber 111 move into the state to be supported by the susceptor 120.

When the substrate W is supported by the susceptor 120, vapor phase growth is performed.

That is, vapor phase growth gas is supplied onto the main surface of the substrate W through the vapor phase growth gas introducing pipe 115 approximately parallel to the main surface, and purge gas is introduced to the lower side of the susceptor 120 through the purge gas introducing pipe 116 approximately parallel to the susceptor 120, while rotating the substrate W with the rotation of the susceptor 120 by rotationally driving the susceptor support member 112 around the vertical axis, and also heating the substrate W on the susceptor 120 to the desired temperature by the heating apparatuses 114. Accordingly, in vapor phase growth, a vapor phase growth gas flow is formed in the upper side of the susceptor 120, and a purge gas flow is formed in the lower side of the susceptor 120, approximately parallel to the susceptor 120 and the substrate W, respectively.

By performing vapor phase growth in this manner, an epitaxial layer is formed on the main surface of the substrate W to be able to manufacture an epitaxial wafer.

After the epitaxial wafer is manufactured, the epitaxial wafer is carried out of the reaction chamber 111.

Figure 19:
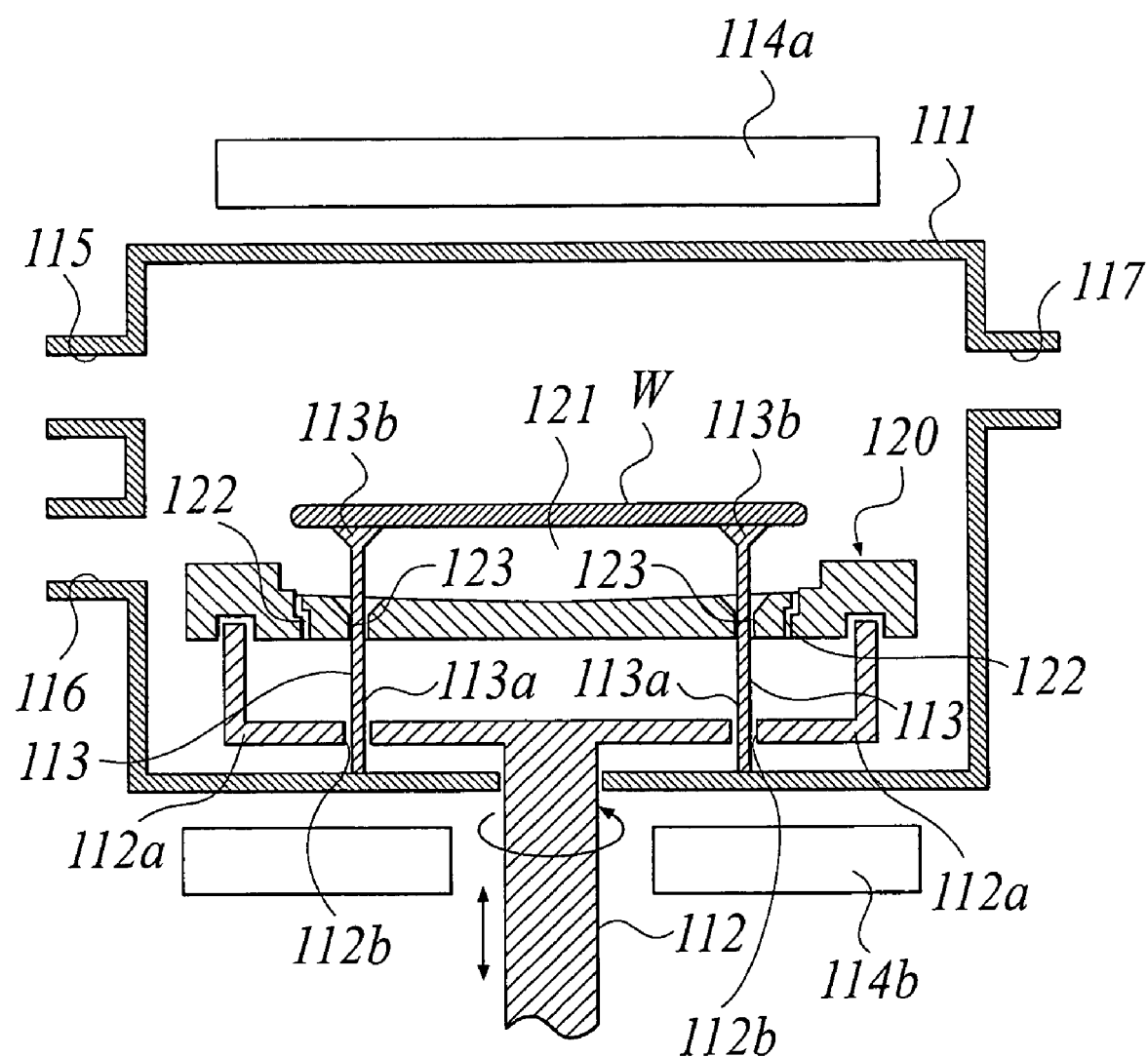
FIG. 19 is a schematic front sectional view showing a preferred example of an epitaxial wafer manufacturing apparatus according to this invention and particularly shows a state that a substrate is supported above a susceptor by lift pins.

That is, the rotation of the susceptor 120 is prestopped, and the susceptor support member 112 is gone down to make each lift pin 113 project an approximately equal length above the susceptor 120 as shown in FIG. 19, thereby making the substrate W go up above the pocket 121 of the susceptor 120 with the projection operation. Then, the substrate W is carried out by the handler which is not shown.

In vapor phase growth, since the substrate W is heated, dopant contained in the substrate W is outdiffused therefrom by the heating, and is released into vapor phase.

Just before vapor phase growth, for example, vapor phase etching is performed by flowing hydrogen chloride gas onto the surface of the substrate W to remove a natural oxide film on the surface, so that the substrate W is slightly gasified for etching. Further, the vapor phase growth gas contains, for example, hydrogen as a carrier gas as well as a source gas, and the purge gas also uses, for example, hydrogen, so that the substrate W (especially, chamfer 15) is slightly etched by this hydrogen to be gasified. Accordingly, for these reasons as well, dopant in the substrate W is released in vapor phase.

That is, by these reasons, in vapor phase growth, dopant is released from inside of substrate in vapor phase.

Contrary to this, the susceptor 120 in this embodiment, comprises though holes 122 penetrating from the surface for supporting the substrate W to the rear surface, and moreover, the through holes 122 are opened even in vapor phase growth, so that it is possible to flow gas through the through holes 122. Accordingly, dopant outdiffused from the substrate W by heating in vapor phase growth, or dopant released from inside of the substrate W by vapor phase etching can be properly released from the rear surface side of the susceptor 120 through the through holes 122. Thus, dopant can be reliably suppressed to go around to the main surface of the substrate W. Therefore, even when an oxide film for preventing autodoping is not formed on the rear surface of the substrate W, the occurrence of the autodoping can be considerably suppressed. As a result, in-plane uniformity of dopant concentration and resistivity can be performed. That is, in-plane uniformity of dopant concentration and resistivity can be easily obtained without any specific process.

Figure 20:
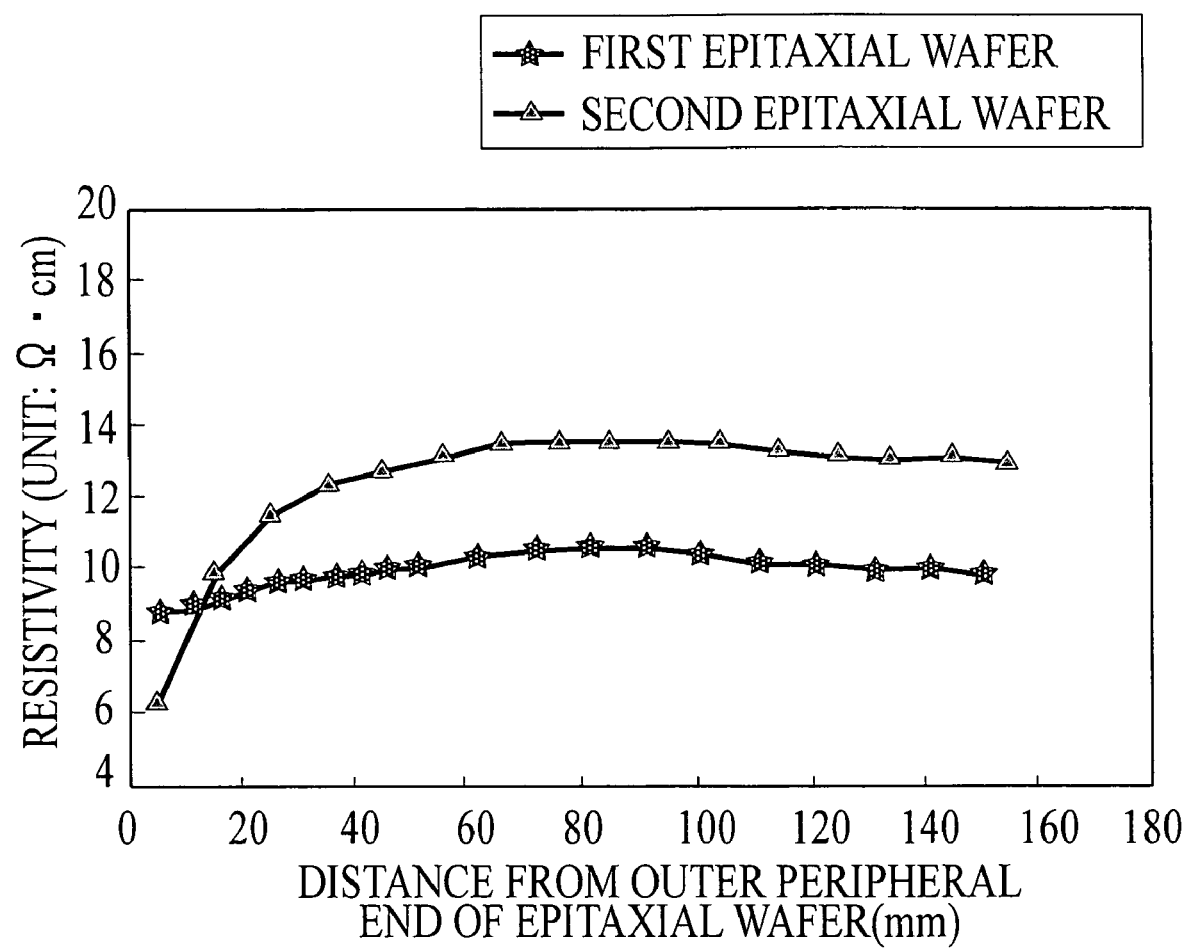
FIG. 20 is a view showing in-plane distribution of resistivity of a silicon epitaxial wafer.

Hereupon, in-plane resistivity (unit: $\Omega \cdot cm$) distributions (from outer peripheral end to center of epitaxial wafer) of the first epitaxial wafer and the second epitaxial wafer are shown in FIG. 20. The first epitaxial wafer is manufactured with the susceptor 120 of this embodiment by vapor phase growth of a p-type silicon epitaxial layer with a thickness of about 6 μm on a main surface of a $p^+$-type silicon single crystal substrate (having no oxide film on a rear surface: hereinafter, referred simply as substrate) having diameter of 300 mm and resistivity of about 0.01 $\Omega \cdot cm$ to 0.02 $\Omega \cdot cm$. The second epitaxial wafer is manufactured with a susceptor which is the same as the susceptor 120 except that the susceptor has no through hole 122 (hereinafter, referred as the first comparative susceptor; not shown) by the same manner.

As shown in FIG. 20, the first epitaxial wafer has in-plane uniformity of resistivity in comparison to the second epitaxial wafer.

That is, it is found out that vapor phase growth performed by using the susceptor 120 having through holes 122 is successful in suppressing the occurrence of autodoping in comparison to the case of performing vapor phase growth by using the first comparative susceptor having no through hole 122.

As a related art to perform in-plane uniformity of dopant concentration by suppressing autodoping, for example as shown in Japanese Patent Application Laid Open No. 223545/1998, there has been proposed a vapor phase growth susceptor provided with holes penetrating to a rear surface at an outermost peripheral portion of a pocket (wafer pocket in the publication), however, in this susceptor, in-plane resistivity (and dopant concentration) distribution is not improved so much. This is because the holes are formed in the outermost peripheral portion of the pocket, the holes are positioned on the outside of the outermost peripheral end of a substrate placed on the pocket. Thus, gas including dopant released from the substrate is carried aloft together with gas flowing into the pocket from the lower side of the susceptor through the holes by air flow (that is, the above vapor phase growth gas flow) on the upper side of the substrate, flowing along the epitaxial layer on the upper surface of the substrate, and then taken into the epitaxial layer.

Contrary to this, in the susceptor 120 of the embodiment, each through hole 122 formed in the inner peripheral side portion 121*b* of the pocket 121 is necessarily positioned on the center side from the outermost peripheral end of the substrate W placed on the pocket 121. Thus, the through holes 122 are positioned in the shadow of the substrate W with respect to the air flow formed in the upper side of the substrate W in vapor phase growth, namely the vapor phase growth gas flow. Therefore, inflow of gas on the lower side of the susceptor 120 in the pocket 121 through the through holes 122 can be suppressed. Accordingly, dopant released from inside of the substrate W can be reliably suppressed to go around to the main surface side of the substrate W. As a result, the occurrence of autodoping can be properly prevented.

In the above described vapor phase growth, as shown in FIG. 18, since the lift pin through holes 123 are closed by the lift pins 113, inflow of gas through the lift pin through holes 123 is substantially impossible, thus, properly releasing dopant released from the substrate W to the rear side of the susceptor 120 through the lift pin through holes 123 is difficult. Accordingly, the lift pin through hole 123 does not produce an effect similar to that of the through hole 122.

Since the through hole 122 of the susceptor 120 in this embodiment comprises the overheat suppressing portions 122*a*, 122*b*, direct heat radiation through the through hole 122 to the substrate W from the heating apparatus 114*b* which is a heat source for heating the substrate W through the susceptor 120 from the rear surface side can be prevented.

Thus, it is possible to suppress local overheating of the substrate W, thereby reliably suppressing the occurrence of variation of film thickness of the epitaxial layer and improving flatness of the epitaxial wafer.

Figure 21A:
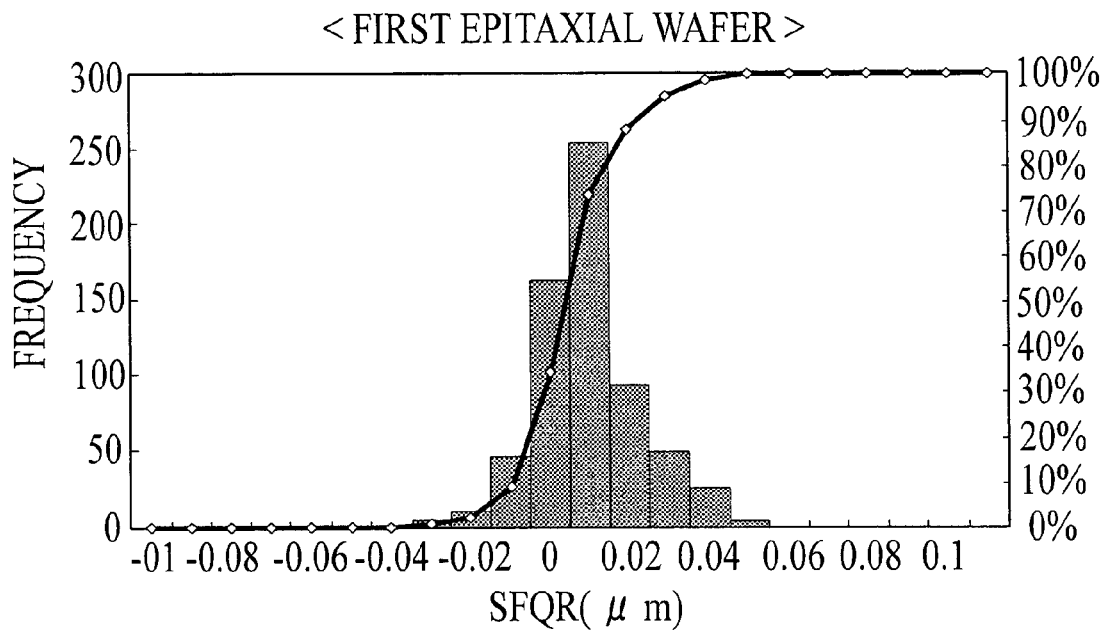
FIG. 21A is a view showing a histogram of SFQR of a silicon epitaxial wafer.
Figure 21B:
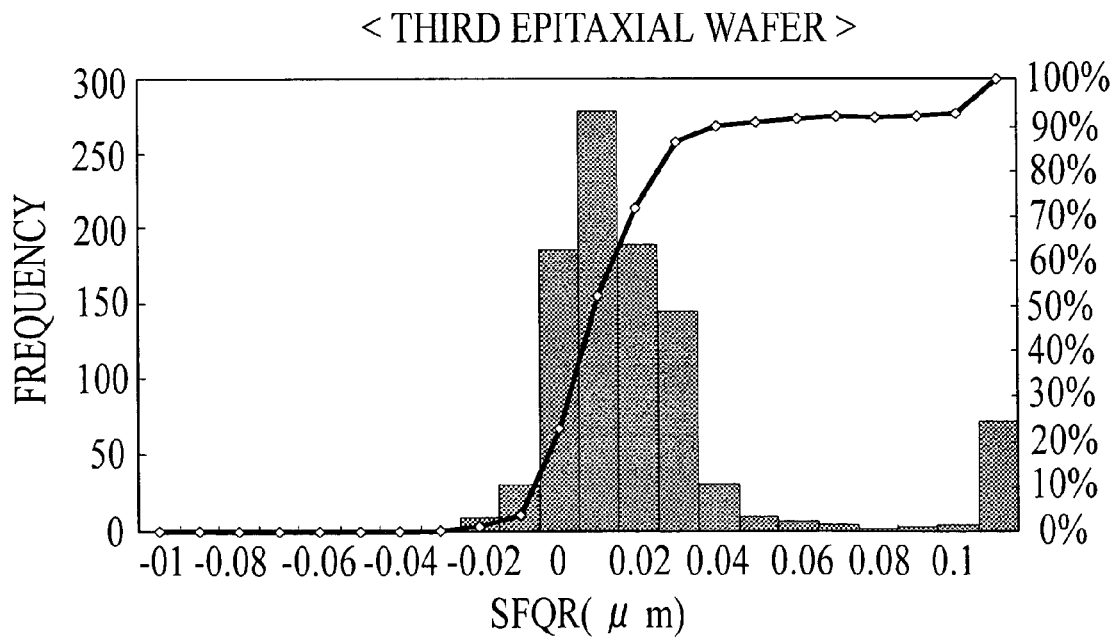
FIG. 21B is a view showing a histogram of SFQR of a silicon epitaxial wafer.
Figure 22B:
FIG. 22B is a view showing in-plane distribution of SFQR of a silicon epitaxial wafer.
Figure 22A:
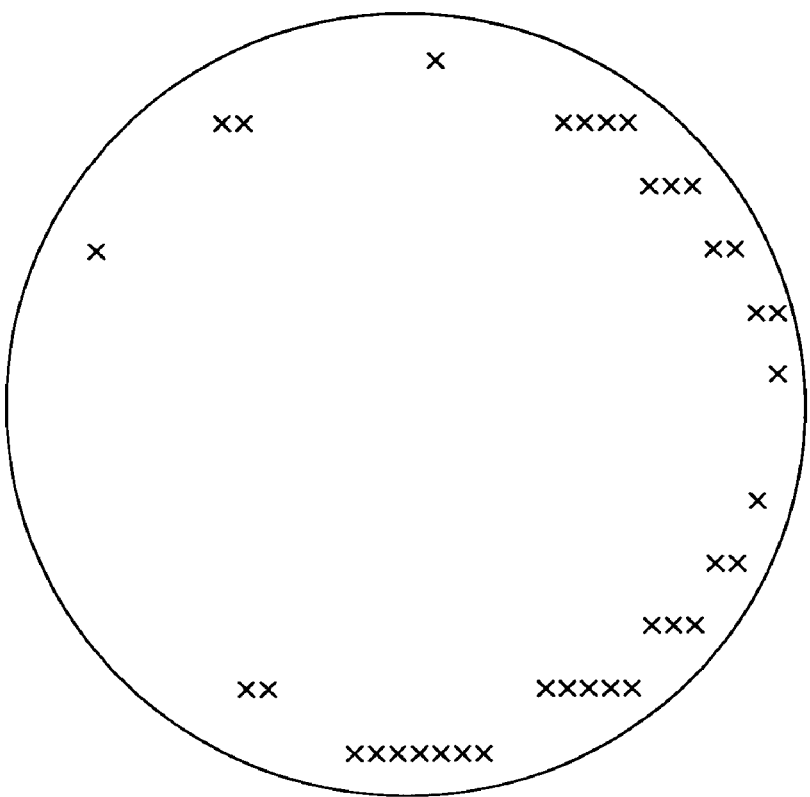
FIG. 22A is a view showing in-plane distribution of SFQR of a silicon epitaxial wafer.
Figure 26:
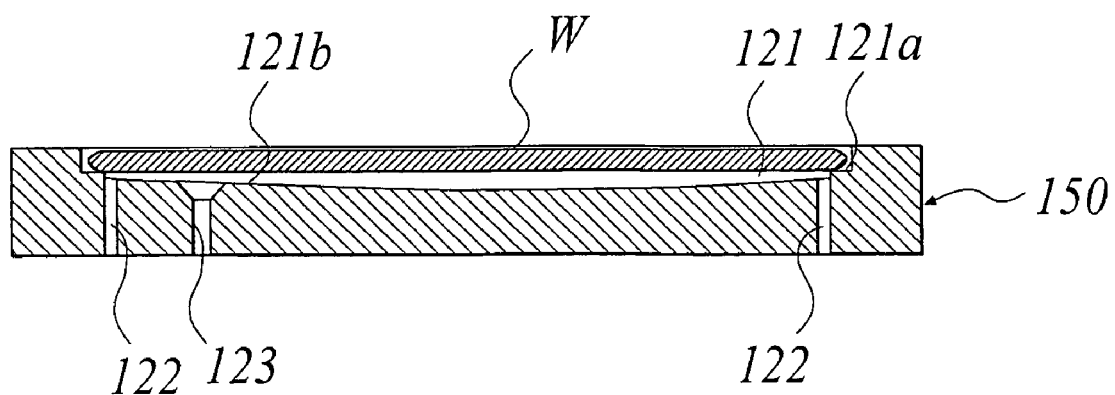
FIG. 26 is a front sectional view showing a susceptor as a comparative example.
Figure 27:
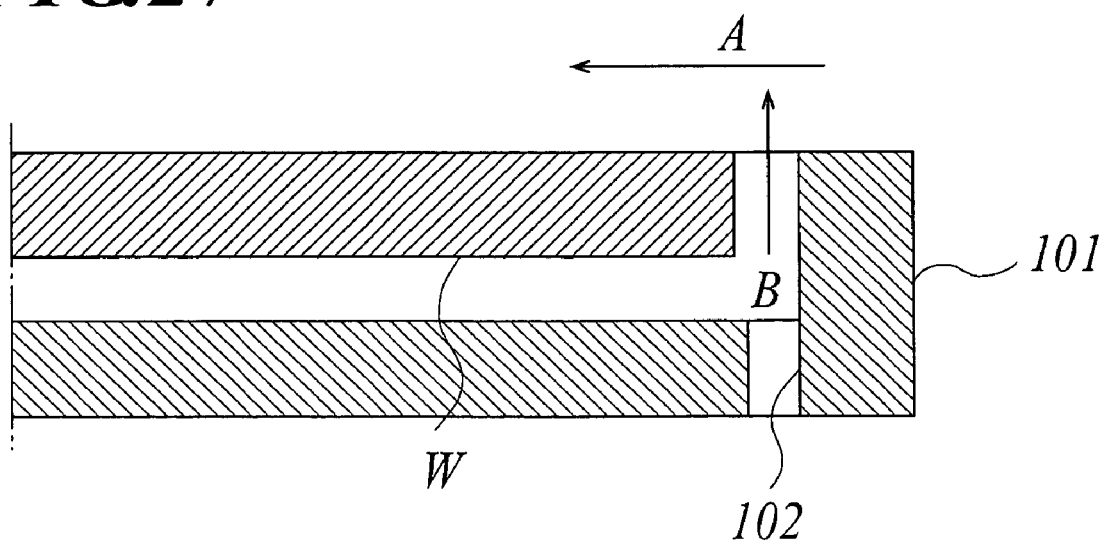
FIG. 27 is an enlarged front sectional view of a main portion of a related art susceptor.

Hereupon, histograms of flatness (SFQR, cell size 25 mm×25 mm, unit: μm) of the above described first epitaxial wafer and a silicon epitaxial wafer (hereinafter, referred as the third epitaxial wafer) manufactured in the same manner by using a susceptor (FIG. 26; hereinafter, referred as the second comparative susceptor 150) which is similar to the susceptor 120 except that the through holes 122 are linearly formed perpendicular to a susceptor surface are shown in FIGS. 21A and 21B. FIGS. 22A and 22B show in-plane distributions of SFQR of the first and the third epitaxial wafers, respectively. On the surface of the epitaxial wafer, only portions where the SFQR value is 0.1 μm or more are marked with "×" in FIGS. 22A and 22B.

As shown in FIGS. 21A and 21B, the first epitaxial wafer has an excellent flatness on the peripheral edge portion (no portion having the SFQR value of 0.1 μm or more) in comparison to the third epitaxial wafer (FIGS. 21B and 22B).

That is, it is found out that when the susceptor 120 in which the through hole 122 has the overheat suppressing portions 122*a*, 122*b* is used for vapor phase growth, flatness of an epitaxial wafer is not deteriorated at a region where the through holes 122 are formed in comparison to the case where the second comparative susceptor 150 in which the through hole 122 does not have an overheat suppressing portion is used for vapor phase growth.

According to the embodiment as described above, since the susceptor 120 comprises the through holes 122 each of which penetrates from the surface for supporting the substrate W to the rear surface, in-plane uniformity of dopant concentration and resistivity can be easily obtained without any specific process.

In addition, the through hole comprises the overheat suppressing portion, it is possible to suppress local overheating of the substrate W, thereby reliably suppressing the occurrence of variation of film thickness of the epitaxial layer.

In the above third embodiment, only the example in which vapor phase growth of a p-type silicon epitaxial layer is performed on a P$^+$-type silicon single crystal substrate was explained, however, this invention is not limited thereto, and the susceptor, vapor phase growth apparatus and the epitaxial wafer manufacturing method in this invention may be applied to the cases of, for example, performing vapor phase growth of a n-type silicon epitaxial layer on a n$^+$-type silicon single crystal substrate, performing vapor phase growth of a p-type silicon epitaxial layer on a n$^+$-type silicon single crystal substrate, performing vapor phase growth of a n-type silicon epitaxial layer on a p$^+$-type silicon single crystal substrate or the like. In these cases also, in-plane uniformity of resistivity (dopant concentration) can be performed.

The example in which this invention is applied only to the susceptor of a single wafer type was explained, however, it is not limited thereto. This invention may be applied to a batch process susceptor.

Further, the example in which the pocket 121 of the susceptor 120 has a two-stage structure having the outer peripheral side portion 121a and the inner peripheral side portion 121b was explained, however it is not limited thereto, and the pocket 121 may have a one-stage structure.

Further, the example in which the pocket 121 (inner peripheral side portion 121b) is formed in a concave curved shape was explained, however, it is not limited thereto, and the pocket 121 may be flat.

Further, the example in which the susceptor 120 comprises the lift pin through holes 123 was explained, however, this invention is not limited thereto, and the susceptor 120 may have no lift pin through hole 123.

Further, the example was explained, in which the hole 122c formed from the surface for supporting the substrate W is positioned on the outer peripheral side of the susceptor 120 from the hole 122d formed from the rear surface side in the two holes 122c, 122d forming the through hole 122, however it is not limited thereto as long as the holes 122c, 122d are shifted in relation to each other for partially overlapping with each other.

<Modification of Through Hole>

Figure 23:
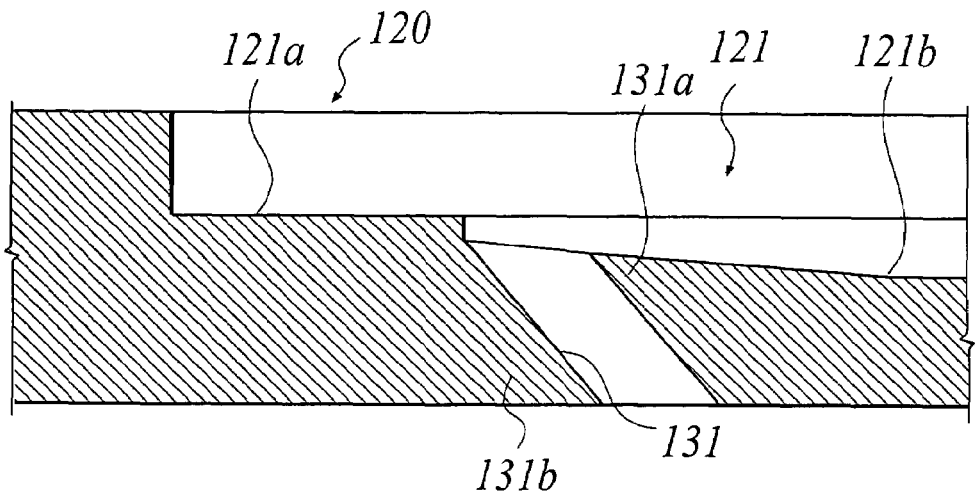
FIG. 23 is an enlarged front sectional view of a main portion showing another example of a through hole.
Figure 24:
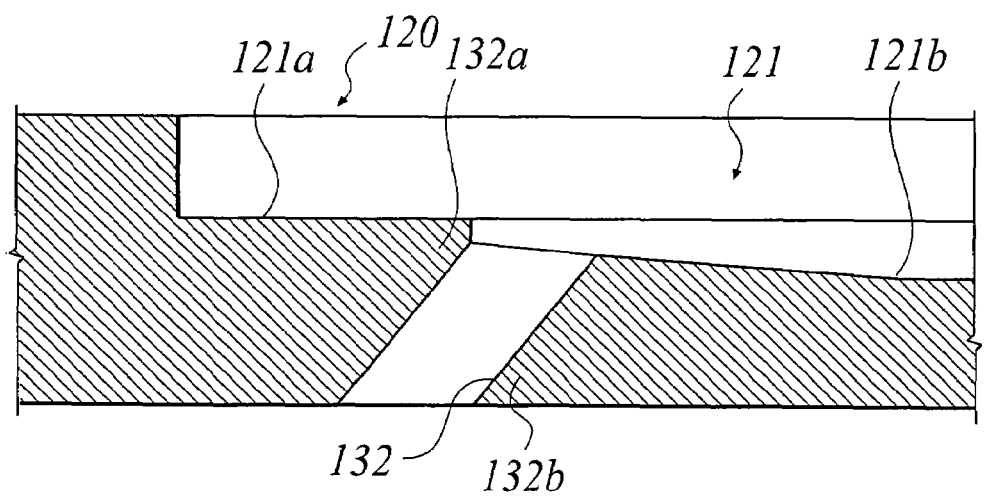
FIG. 24 is an enlarged front sectional view of a main portion showing another example of a through hole.

The through hole is not limited to the above described example, and for example, as shown in FIGS. 23 and 24, the through hole may be linearly formed as long as the through hole is inclined so as to generate a shift between the positions of an opening portion in the surface for supporting the substrate W and an opening portion in the rear surface (with respect to a direction perpendicular to the susceptor surface). In this case, the inclination direction of the through hole is arbitrary set. In the case of a through hole 131 shown in FIG. 23, edge portions of the through hole 131 form overheat suppressing portions 131a, 131b in the susceptor 120. Similarly, in the case of a through hole 132 shown in FIG. 24, edge portions of the through hole 132 form overheat suppressing portions 132a, 132b in the susceptor 120.

Figure 25:
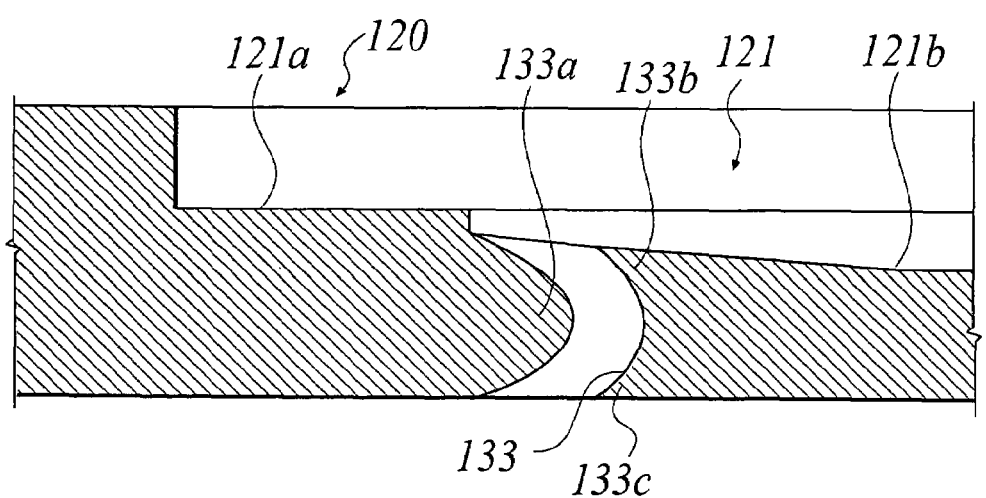
FIG. 25 is an enlarged front sectional view of a main portion showing another example of a through hole.

As shown in FIG. 25, the through hole 133 may have a curved shape (circular arc shape). In this case also, edge portions of the through hole 133 form overheat suppressing portions 133a, 133b, 133c in the susceptor 120.

INDUSTRIAL APPLICATION

According to the susceptor, the vapor phase growth apparatus and the epitaxial wafer manufacturing method in this invention, since dopant released from inside of a semiconductor substrate in vapor phase growth can properly be released from the lower surface side of the susceptor through the holes formed in the pocket of the susceptor, dopant can be reliably suppressed to go around to the main surface side of the substrate. Therefore, the occurrence of autodoping can be significantly prevented without forming an oxide film for preventing autodoping on the rear surface of the substrate. As a result, in-plane uniformity of dopant concentration and resistivity can be performed. That is, in-plane uniformity of dopant concentration and resistivity can be easily obtained.

Further, according to this invention, since the susceptor has through holes penetrating from the surface for supporting the semiconductor substrate to the rear surface, dopant outdiffused from the semiconductor substrate by heating in vapor phase growth, or dopant released from inside of the semiconductor substrate by vapor phase etching can be properly released from the rear surface side of the susceptor through the through holes. Thus, it can be properly suppressed that these dopant go around to the main surface side of the substrate. Therefore, the occurrence of autodoping can be significantly prevented without forming an oxide film for preventing autodoping on the rear surface of the substrate. As a result, in-plane uniformity of dopant concentration and resistivity can be performed. That is, in-plane uniformity of dopant concentration and resistivity can be easily obtained without any specific process.

In addition, since the through hole comprises the overheat suppressing portions, direct heat radiation through the through holes to the semiconductor substrate from a heat source can be prevented. Thus, it is possible to suppress local overheating of the semiconductor substrate, thereby reliably suppressing the occurrence of variation of film thickness of an epitaxial layer.

Accordingly, the susceptor, the vapor phase growth, the epitaxial wafer manufacturing apparatus and the epitaxial wafer manufacturing method in this invention are particularly suitable for manufacturing an epitaxial wafer by vapor phase growth of an epitaxial layer onto a main surface of a semiconductor substrate.

The invention claimed is:

1. A susceptor supporting a semiconductor substrate in a vapor phase growth comprising: a through hole penetrating from a surface for supporting the semiconductor substrate to a rear surface, wherein the through hole comprises an overheat suppressing portion for suppressing a local overheating of the semiconductor substrate by preventing a direct heat radiation through the through hole from a heat source for heating the semiconductor substrate supported by the susceptor from a rear surface side through the susceptor.

2. A susceptor supporting a semiconductor substrate in a vapor phase growth, wherein holes are formed from a surface for supporting the semiconductor substrate and a rear surface thereof, respectively, the holes being shifted in relation to each other for partially overlapping with each other, each of the holes is formed to have a depth to communicate with each other inside the susceptor without penetrating the susceptor, and a through hole which penetrates from the surface for supporting the semiconductor substrate to the rear surface is formed by a combination of the holes.

3. An epitaxial wafer manufacturing apparatus for manufacturing an epitaxial wafer by performing a vapor phase growth of an epitaxial layer on a main surface of a semiconductor substrate comprising: the susceptor as claimed in claim 1 or 2.

4. An epitaxial wafer manufacturing method comprising:
performing a vapor phase growth of an epitaxial layer on a main surface of a semiconductor substrate supported by the susceptor as claimed in claim 1 or 3 and manufacturing an epitaxial wafer.

\* \* \* \* \*